United States Patent
Naito et al.

(10) Patent No.: US 6,292,350 B1
(45) Date of Patent: Sep. 18, 2001

(54) MULTILAYER CAPACITOR

(75) Inventors: Yasuyuki Naito, Takefu; Masaaki Taniguchi; Yoiohi Kuroda, both of Fukui-ken; Takanori Kondo, Sabae; Michihiro Murata; Yoshitaka Tanino, both of Kyoto, all of (JP)

(73) Assignee: Murata Manufacturing, Co., LTD, Kyoto (JP)

( * ) Notice: Subject to any disclaimer, the term of this patent is extended or adjusted under 35 U.S.C. 154(b) by 0 days.

(21) Appl. No.: 09/501,087

(22) Filed: Feb. 9, 2000

Related U.S. Application Data

(63) Continuation-in-part of application No. 09/042,379, filed on Mar. 13, 1998, now Pat. No. 6,072,687.

(30) Foreign Application Priority Data

Nov. 10, 1997 (JP) .................................................. 9-306717
Dec. 27, 1999 (JP) .................................................. 11-370803

(51) Int. Cl.⁷ ........................... H01G 4/005; H01G 4/228
(52) U.S. Cl. .................... 361/306.3; 361/303; 361/306.1; 361/308.1
(58) Field of Search .............................. 361/301.4, 303, 361/306.1, 306.3, 308.1, 309–313, 320, 321.1–321.5, 330, 329; 29/25.41, 25.42

(56) References Cited

U.S. PATENT DOCUMENTS 3,308,359  3/1967  Hayworth et al. .
3,612,963  10/1971  Piper et al. .

(List continued on next page.)

FOREIGN PATENT DOCUMENTS 25 45 672  4/1977  (DE) .
0 191 668  8/1986  (EP) .
1464631  11/1965  (FR) .

(List continued on next page.)

OTHER PUBLICATIONS

1991 Symposium on VLSI Technology, Digest of Technical Papers entitled Multilayer Vertical Stacked Capacitors (MVDTC) for 64 Mbit and 256 MBIT DRAMS by D. Temmler, Institute of Semiconductor Physics, Germany.

(List continued on next page.)

*Primary Examiner*—Anthony Dinkins
(74) *Attorney, Agent, or Firm*—Keating & Bennett, LL

(57) ABSTRACT

A multi-layer capacitor including a capacitor body having four sides including a first pair of opposed sides and a second pair of opposed sides, the capacitor body including a plurality of dielectric layers and at least a pair of first and second internal electrodes that oppose each other via one of the dielectric layers, the first internal electrode having first lead-out portions, the second internal electrode having second lead-out portions, the first and second lead-out portions being arranged to interdigitate with each other. The first polarity external electrode terminals are electrically connected to the first lead-out portions. At least one of the first polarity external electrode terminals is arranged on each of the first pair of opposed sides and at least one of the first polarity external electrode terminals being arranged on each of the second pair of opposed sides of the capacitor body. Second polarity external electrode terminals are electrically connected to the second lead-out portions. At least one of the second polarity external electrode terminals is arranged on each of the first pair of opposed sides and at least one of the second polarity external electrode terminals is arranged on each of the second pair of opposed sides of the capacitor body. Each of the lead structures of the first and second electrode plates have a length L and a width W and a ratio L/W is equal to about 3 or less and preferably between 0.4 and 1.3.

88 Claims, 10 Drawing Sheets

U.S. PATENT DOCUMENTS

| | | |
|---|---|---|
| 3,822,397 | 7/1974 | Puppolo et al. . |
| 3,971,970 | 7/1976 | Voyles et al. . |
| 4,074,340 | 2/1978 | Leigh . |
| 4,274,124 | 6/1981 | Feinberg et al. . |
| 4,295,183 | 10/1981 | Miersch et al. . |
| 4,328,530 | 5/1982 | Bajorek et al. . |
| 4,346,429 | 8/1982 | DeMatos . |
| 4,419,714 | 12/1983 | Locke . |
| 4,424,552 | 1/1984 | Saint Marcoux . |
| 4,430,690 | 2/1984 | Chance et al. . |
| 4,706,162 | 11/1987 | Hernandez et al. . |
| 4,814,940 | 3/1989 | Horstmann et al. . |
| 4,830,723 | 5/1989 | Galvagni et al. . |
| 4,831,494 | 5/1989 | Arnold et al. . |
| 4,852,227 | 8/1989 | Burks . |
| 4,853,826 | 8/1989 | Hernandez . |
| 4,862,318 | 8/1989 | Galvagni et al. . |
| 5,517,385 | 5/1996 | Galvagni et al. . |
| 5,880,925 | 3/1999 | DuPre et al. . |

FOREIGN PATENT DOCUMENTS

| | | |
|---|---|---|
| 2 707 123 | 6/1993 | (FR) . |
| 2-256216 | 10/1990 | (JP) . |
| 4-42910 | 2/1992 | (JP) . |
| 6-140283 | 5/1994 | (JP) . |
| 6-260364 | 9/1994 | (JP) . |
| 8-172026 | 7/1996 | (JP) . |

OTHER PUBLICATIONS

IBM Technical Disclosure Bulletin (vol. 31 No. 3 Aug. 1988).

IBM Technical Disclosure Bulletin (vol. 32 No. 6B Nov. 1989).

40th Electronic Components & Technology Conference, 1990 Poster Presentations, vol. 2, May 20–23, 1990, pp. 1014–1023.

MULTILAYER CAPACITOR

This application is a Continuation-in-Part of U.S. patent application Ser. No. 09/042,379 filed on Mar. 13, 1998 now U.S. Pat. No. 6,072,687.

BACKGROUND OF THE INVENTION

1. Field of the Invention

The present invention relates to a multi-layer capacitor and, more particularly, to a multi-layer capacitor which can be advantageously used in high frequency circuits.

2. Description of the Related Art

Conventional multi-layer capacitors include those described in Japanese Unexamined Patent Publication No. H2-256216 in which a multi-layer capacitor 1, as shown in FIGS. 15 through 17 of the present application, is disclosed. FIG. 15 is a plan view of the external appearance of the multi-layer capacitor 1. FIG. 16 is a plan view of a first section of the multi-layer capacitor 1 showing a first electrode 10 located on one surface of one internal dielectric layer 9 of the capacitor 1. FIG. 17 is a plan view of a second section of the multi-layer capacitor 1 showing a second electrode 11 located on one surface of a differential internal dielectric layer 9 of the capacitor 1.

Referring to FIGS. 15–17, the multi-layer capacitor 1 includes a capacitor main body 8 in the form of a rectangular parallelpiped having two principal surfaces 2 and 3 in a face-to-face relationship with each other and four side surfaces 4, 5, 6 and 7 connecting the principal surfaces 2 and 3. The capacitor main body 8 includes a plurality of dielectric layers 9 (FIGS. 16–17) made of, for example, a ceramic dielectric material. Each of the dielectric layers is generally planar in shape and lies generally parallel to the principal surfaces 2 and 3. At least a pair of first and second internal electrodes 10 and 11 are provided on respective surfaces of the dielectric layers 9 in a face-to-face relationship with each other, with a dielectric layer 9 interposed therebetween to form a capacitor unit.

The first internal electrode 10 is formed with four lead electrodes 12, 13, 14 and 15 which extend to two opposing side surfaces 4 and 6, as shown.

Each lead electrode 12, 13, 14 and 15 is coupled to a respective external terminal electrode 16, 17, 18 and 19 provided on the side surfaces 4 and 6 of the capacitor main body 8. Specifically, the lead electrodes 12 and 13 are connected to the external terminal electrodes 16 and 17, respectively, which are located on the side surface 4, and the lead electrodes 14 and 15 are connected to the external terminal electrodes 18 and 19, respectively, which are located on the side surface 6.

Referring to FIG. 17, the second internal electrode 11 is also formed with four lead electrodes 20, 21, 22 and 23 which extend to the side surfaces 4 and 6, respectively. More specifically, the lead electrodes 20 and 21 extend to positions on the side surface 4 which are different from the positions to which the lead electrodes 12 and 13 extend, and the lead electrodes 22 and 23 extend to positions on the side surface 6 of the main body 8 which are different from the positions to which the lead electrodes 14 and 15 extend.

The lead electrodes 20 through 23 are electrically coupled to external terminal electrodes 24, 25, 26 and 27, respectively. External terminal electrodes 24 and 25 are located on the side surface 4 at positions which are different from those of the external terminal electrodes 16 and 17. External terminal electrodes 26 and 27 are located on the side surface 6 at positions which are different from the positions of the external terminal electrodes 18 and 19.

Thus, the plurality of first external terminal electrodes 16 through 19 and the plurality of second external terminal electrodes 24 through 27 are arranged on the two side surfaces 4 and 6 such that they alternate adjacently to each other.

FIG. 18 illustrates current flowing through the multi-layer capacitor 1 as viewed in plan view corresponding to FIG. 17. In FIG. 18, first internal electrode 10 and second internal electrode 11, shown with broken and solid lines, respectively, are shown in an overlapping relationship.

In FIG. 18, the arrows indicate typical current paths and directions. In the state illustrated, current flows from each of the external terminal electrodes 24 through 27 to each of the external terminal electrodes 16 through 19. Because an alternating current is used, the direction of current flow will reverse periodically.

When the currents flow, magnetic flux is induced. The direction of the flux is determined by the direction of the currents to produce self-inductance components. Since the currents flow in various directions at central regions 28 (indicated by circles) of the internal electrodes 10 and 11, the induced magnetic flux generated by the various currents is canceled and substantially no net magnetic flux is produced in those regions.

The current in the vicinity of each of the external terminal electrodes 16 through 19 and 24 through 27 tends to flow toward each of the external terminal electrodes 16 through 19 and away from each of the external terminal electrodes 24 through 27. There are currents that flow to the left and right as viewed in FIG. 18 to spread at an angle of about 180 degrees. As a result, a major part of magnetic flux is canceled and there is no significant generation of net magnetic flux in these areas.

Therefore, in the multi-layer capacitor 1 shown in FIGS. 15 through 17, the generation of self-inductance is suppressed in the areas points described above to reduce equivalent series induction (hereinafter "ESL").

However, currents flow substantially in the same direction in the vicinity of each of the side surfaces 5 and 7 on which no external terminal electrodes are provided, i.e., at each of the left and right edge portions indicated by hatching in FIG. 18. This results in substantially no cancellation of magnetic flux in these areas and significant net self-inductance is created. Therefore, the measures taken to reduce ESL in the multi-layer capacitor 1 shown in FIGS. 15 through 17 are less than desirable.

SUMMARY OF THE INVENTION

To overcome the problems described above, preferred embodiments of the present invention provide a multi-layer capacitor which more effectively reduces ESL.

In accordance with a preferred embodiment the present invention, a multi-layer capacitor includes a capacitor body having four sides including a first pair of opposed sides and a second pair of opposed sides, the capacitor body including a plurality of dielectric layers and at least a pair of first and second internal electrodes that oppose each other via one of the dielectric layers to define a capacitor unit, the first internal electrode having first lead-out portions, the second internal electrode having second lead-out portions, the first and second lead-out portions being arranged to interdigitate with each other, first polarity external electrode terminals being electrically connected to the first lead-out portions, at least one of the first polarity external electrode terminals being arranged on each of the first pair of opposed sides and at least one of the first polarity external electrode terminals being arranged on each of the second pair of opposed sides of the capacitor body and second polarity external electrode terminals being electrically connected to the second lead-out portions, at least one of the second polarity external electrode terminals being arranged on each of the first pair of opposed sides and at least one of the second polarity external electrode terminals being arranged on each of the second pair of opposed sides of the capacitor body, at least one of the lead structures of the first and second electrode plates have a length L and a width W and a ratio L/W is equal to about 3 or less.

In accordance with another preferred embodiment the present invention, a multi-layer capacitor includes a capacitor body having four sides including a first pair of opposed sides and a second pair of opposed sides, the capacitor body including a plurality of dielectric layers and at least a pair of first and second internal electrodes that oppose each other via one of the dielectric layers to define a capacitor unit, the first internal electrode having first lead-out portions, the second internal electrode having second lead-out portions, the first and second lead-out portions being arranged to interdigitate with each other, first polarity external electrode terminals being electrically connected to the first lead-out portions, at least two of the first polarity external electrode terminals being arranged on each of the first pair of opposed sides and at least one of the first polarity external electrode terminals being arranged on at least one of the second pair of opposed sides of the capacitor body, and second polarity external electrode terminals being electrically connected to the second lead-out portions, at least two of the second polarity external electrode terminals being arranged on each of the first pair of opposed sides and at least one of the second polarity external electrode terminals being arranged on at least one of the second pair of opposed sides of the capacitor body, wherein a total number of the first polarity external electrode terminals and the second polarity external electrode terminals on each of the first pair of opposed sides and on each of the second pair of opposed sides is even and at least one of the lead structures of the first and second electrode plates have a length L and a width W and a ratio L/W is equal to about 3 or less.

In other preferred embodiments based on the two preferred embodiments described above, it is preferred that the ratio L/W is equal to about 1.3 or less and equal to about 0.4 or greater.

Further, it is preferred that the width W of at least one of the lead electrodes is different from that of the other lead electrodes.

In other preferred embodiments, lead electrodes are provided on each of a first pair of opposed sides of the capacitor body and a lead electrode is provided on each of a second pair of opposed sides of the capacitor body, and the width W of at least one of the lead electrodes provided on a respective one of the second pair of opposed sides of the capacitor body is wider than the lead electrodes disposed on each of the first pair of opposed sides of the capacitor body.

Also, it is preferred that the lengths L of all of the lead electrodes are substantially equal to each other.

The internal and lead electrodes are preferably arranged in such a manner that when currents of different polarity are applied to the first and second internal electrodes, the net induced inductance in the area of all four of the side surfaces is substantially zero.

In a preferred embodiment of the present invention, the first internal electrode is formed with at least four first lead electrodes which extend respectively to respective ones of the four side surfaces. An equal number of first external terminal electrodes are provided. At least one of the first external terminal electrodes is located on each of the four side surfaces.

In this preferred embodiment, the second internal electrode is formed with at least four second lead electrodes which extend to respective ones of the four side surfaces. An equal number of second external terminal electrodes are provided. At least one of the second external terminal electrodes is located on each of the four side surfaces.

It is more advantageous if the above-described configuration is used for both of the first and second internal electrodes.

In another preferred embodiment, for each side surface which has both a first and a second external terminal electrode, each of the first external terminal electrodes located on that surface is located adjacent to one a corresponding second external terminal electrode located on that side surface. It is more advantageous if all of the first external terminal electrodes and all of the second external terminal electrodes are arranged such that they alternate with each other throughout the four side surfaces.

In yet another preferred embodiment, all of the external terminal electrodes are arranged such that they are not adjacent to any other external electrode which is connected to the same internal electrode.

In still another preferred embodiment, the first internal electrode is formed with three first lead electrodes which extend respectively to three of the side surfaces. The second internal electrode is formed with two second lead electrodes which extend respectively to two of the side surfaces, one of which does have a first external electrode.

In another preferred embodiment, at least one of the first and at least one of the second external terminal electrodes is provided on each of the four side surfaces.

A plurality of capacitor units can be provided in the multi-layer capacitor. Each capacitor unit includes a respective pair of first and second internal electrodes with a respective dielectric layer located therebetween.

According to various preferred the present invention, the effect of reducing ESL can be expected from effective cancellation of magnetic and reduction of the lengths of currents achieved by providing a third internal electrode facing at least either the first or second internal electrodes with a dielectric material layer interposed therebetween. The third internal electrode is formed with at least two third lead electrodes which extend to respective ones of the side surfaces. An equal number of third external terminal electrodes are provided on the corresponding side surfaces and are electrically coupled to respective ones of the third lead electrode.

In the above-described preferred embodiment, when all of the first, second and third external terminal electrodes are arranged in the same order of arrangement repeated throughout the four side surfaces, the various components of magnetic flux can be more effectively canceled and the lengths of the current paths can be shortened further for a further reduction of ESL.

Other features, characteristics, elements and advantages of preferred embodiments of the present invention will be described in more detail below with reference to the figures attached hereto.

BRIEF DESCRIPTION OF THE DRAWINGS

For the purpose of illustrating the invention, there is shown in the drawing several forms which are presently preferred, it being understood, however, that the invention is not limited to the precise arrangements and instrumentalities shown.

DETAILED DESCRIPTION OF PREFERRED EMBODIMENTS

First Preferred Embodiment

Figure 1:
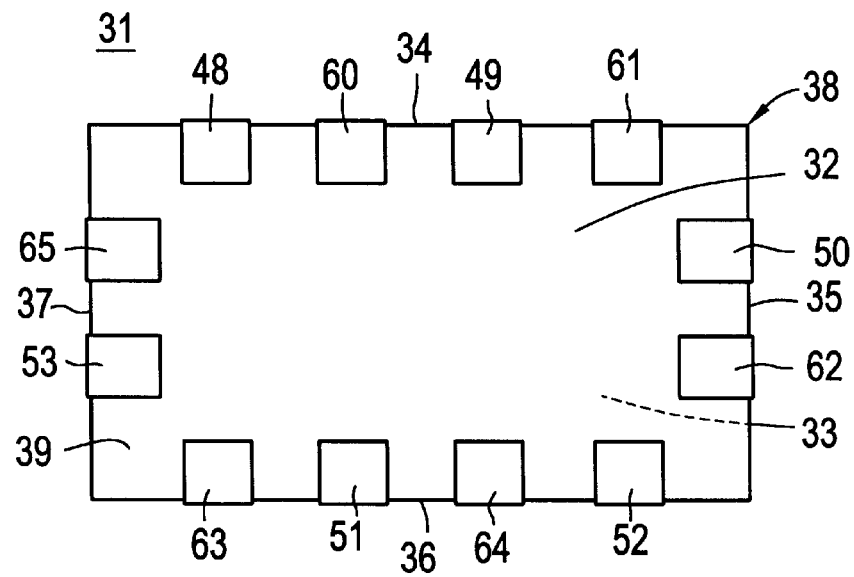
FIG. 1 is a plan view of a multi-layer capacitor 31 according to a first preferred embodiment of the present invention.
Figure 2:
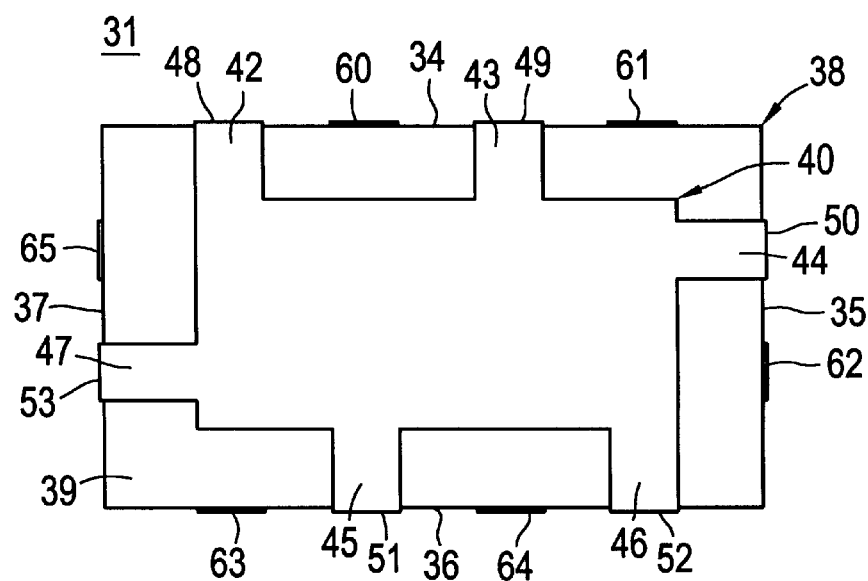
FIG. 2 is a plan view of the multi-layer capacitor 31 shown in FIG. 1 showing an internal structure thereof in the form of a section along which a first internal electrode 40 extends.
Figure 3:
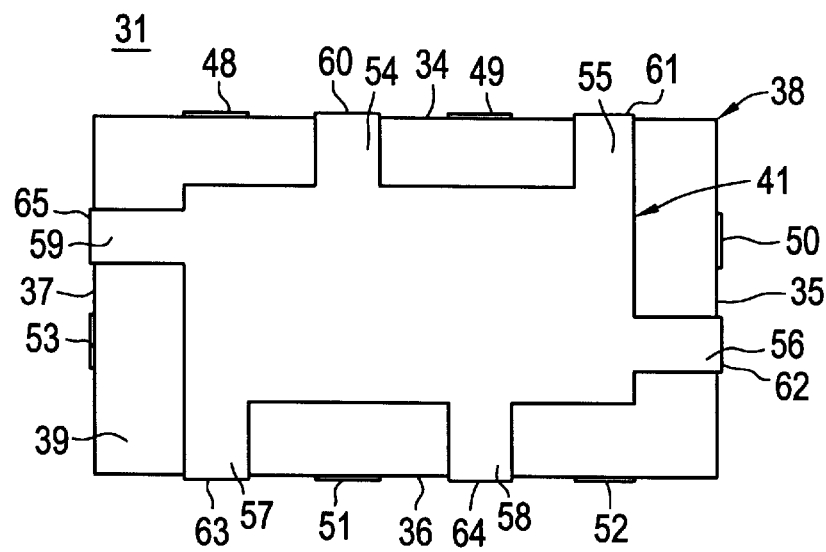
FIG. 3 is a plan view of the multi-layer capacitor shown 31 in FIG. 1 showing an internal structure thereof in the form of a section along which a second internal electrode 41 extends.

Referring now to the drawings, wherein like numerals indicate like elements, there is shown in FIGS. 1 through 3 a first preferred embodiment of a multi-layer capacitor constructed in accordance with the principles of the present invention and designated generally as 31. FIGS. 1 through 3 correspond to FIGS. 15 through 17.

FIG. 1 is a plan view of the external appearance multi-layer capacitor 31. FIG. 2 is a plan view multi-layer capacitor 31 showing a first internal electrode 40 located on one surface of a first internal dielectric layer 39 of the capacitor 31. FIG. 3 is a plan view of a second section of the multi-layer capacitor 31 showing a second internal electrode 41 located on one surface of a second internal dielectric layer 39 of the capacitor 31.

Multi-layer capacitor 31 includes a capacitor main body 38 in the form of a rectangular parallelpiped having two opposed principal surfaces 32 and 33 and four side surfaces 34, 35, 36 and 37 extending therebetween. The capacitor main body 38 includes a plurality of generally planar dielectric layers 39 made of, for example, a ceramic dielectric material. The main surfaces of the dielectric layers 39 are situated generally parallel to the principal surfaces 32, 33 of the capacitor main body 38. At least a pair of first and second internal electrodes 40 and 41 are provided in a face-to-face relationship with each other with a dielectric material layer 39 interposed therebetween, each such pair of internal electrodes forming a respective capacitor unit.

As shown in FIG. 2, the first internal electrode 40 has six lead electrodes 42, 43, 44, 45, 46 and 47, each of which extends to a respective one of the four side surfaces 34 through 37. Particularly, the lead electrodes 42 and 43 extend to the side surface 34; the lead electrode 44 extends to the side surface 35; the lead electrodes 45 and 46 extend to the side surface 36; and the lead electrode 47 extends to the side surface 37.

Each lead electrode 42–47 is electrically coupled to a respective external terminal electrodes 48–53. The external terminal electrodes 48 and 49, connected to the lead electrodes 42 and 43, respectively, are located on the side surface 34; the external terminal electrode 50, connected to the lead electrode 44, is located on the side surface 35; the external terminal electrodes 51 and 52, connected to the lead electrodes 45 and 46, respectively, are located on the side surface 36; and the external terminal electrode 53, connected to the lead electrode 47, is located on the side surface 37.

As shown in FIG. 3, the internal electrode 41 is formed with six second lead electrodes 54, 55, 56, 57, 58 and 59, each of which extends to a respective one of the four side surfaces 34 through 37. More specifically, the lead electrodes 54 and 55 extend to side surface 34; lead electrode 56 extends to side surface 35; lead electrodes 57 and 58 extend to side surface 36; and lead electrode 59 extends to the side surface 37.

The positions on the side surfaces 34 through 37 to which the respective lead electrodes 54 through 59 extend are different from the positions to which the respective lead electrodes 42 through 47 extend.

External terminal electrodes 60, 61, 62, 63, 64 and 65, which are electrically coupled to respective lead electrodes 54 through 59, are provided on the side surfaces 34 through 37 at positions which are different than the positions of the external terminal electrodes 48 through 53. External terminal electrodes 60 and 61, connected to lead electrodes 54 and 55, respectively, are located on side surface 34; external terminal electrode 62, connected to lead electrode 56, is located on side surface 35; external terminal electrodes 63 and 64, connected to lead electrodes 57 and 58, respectively, are located on side surface 36; and external terminal electrode 65, connected to lead electrode 59, are located on side surface 37.

The external terminal electrodes 48 through 53 are arranged in an interleaved manner such that no two external electrodes which are electrically coupled to the same internal electrode 40 or 41 are adjacent one another. In operation, the polarizations of the first and second internal electrodes 40, 41 are preferably opposite to one another.

In order to increase the capacity of the multi-layer capacitor 31, additional pairs of internal electrodes can be provided to define additional capacitor units. For example, the multi-layer capacitor 31 can include two sets of capacitor units, each set being defined by a respective pair of first and second internal electrodes 40, 41 separated by a respective dielectric layer. The plurality of capacitor units are preferably connected in parallel by at least either appropriate ones of the first external terminal electrodes 48 through 53 or the second external terminal electrodes 60 through 65.

Each of the external terminal electrodes 48 through 53 and 60 through 65 is preferably formed so as to extend not only on the side surfaces 34 through 37 but also onto a part of each of the principal surfaces 32 and 33.

Figure 4:
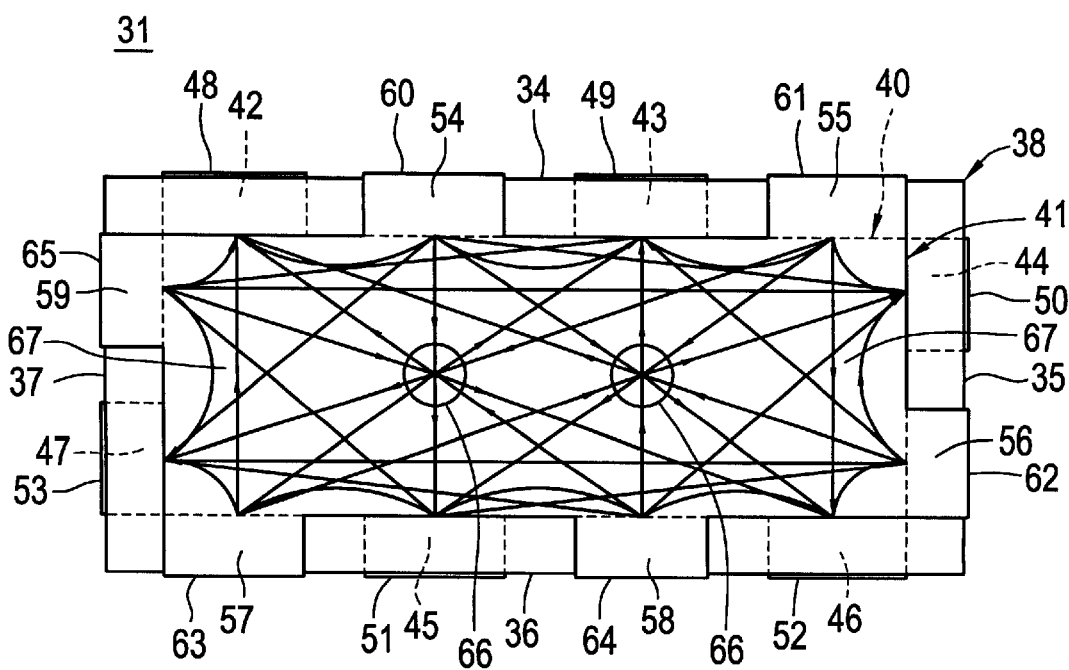
FIG. 4 is a plan view illustrating currents flowing in the multi-layer capacitor 31.

FIG. 4 illustrates various currents, flowing in the multi-layer capacitor 31. In FIG. 4, the first internal electrode 40 is indicated by a broken line and the second internal electrode 41 is indicated by a solid line, the two electrodes being illustrated in an overlapping relationship.

As apparent from these typical paths and the directions of current flow indicated by the arrows in FIG. 4 (the direction of current flow indicates that direction of each of the noted current paths at a given point in time, the direction of the flow of current through these paths will alternate periodically), a current flows from each of the second external terminal electrodes 60 through 65 to each of the first external terminal electrodes 48 through 53. When such currents flow, induced magnetic flux is generated.

Figure 18:
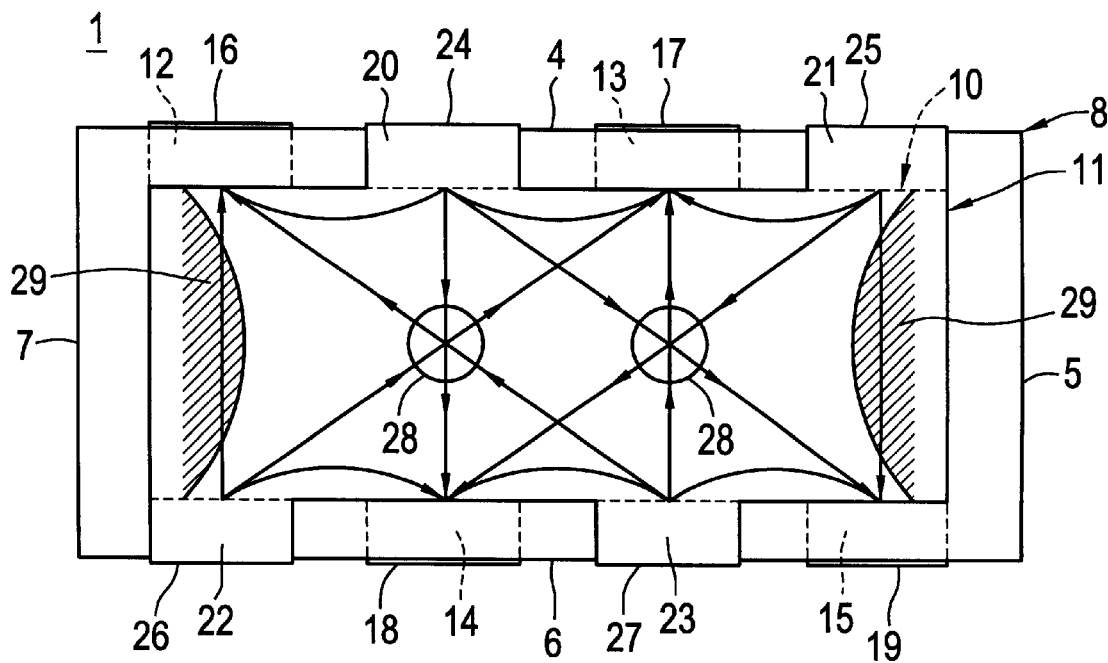
FIG. 18 is a plan view illustrating currents flowing in the multi-layer capacitor 1 shown in FIG. 15.

As in the prior art, the various components of the induced flux at the central regions 66 indicated by the circles cancel one another out because currents flow in various directions. Similarly, the various components of the induced flux in the areas of the side surfaces 34 and 36 tend to cancel one another. In this connection, current flow in the area of side surfaces 34 and 36 is very similar to that of the prior art of FIG. 18.

However, the embodiment of FIGS. 1–4 produces a much more desirable result in the areas 67 adjacent the side surfaces 35, 37. Since the first external terminal electrodes 50 and 53 and the second external terminal electrodes 62 and 65 are provided at the side surfaces 34 and 36, there is no significant net current flow in the areas 67 and no significant generation of net magnetic flux.

As a result, the degree of net induced magnetic flux generated over the entire region of the multi-layer capacitor 31 is significantly reduced, thereby allowing the ESL to be suppressed to a very low level.

Another advantage of this embodiment is that the current paths between each of the electrodes is reduced. Particularly, each of the first lead electrodes 42 through 47 (and the first external terminal electrodes 48 through 53) is located relatively close to its adjacent second lead electrode 54 through 59 (and the second external terminal electrode 60 through 64) compared to the prior art of FIG. 18. This reduces the lengths of the current paths and thereby reduces self-inductance components produced between them.

Second Preferred Embodiment

Figure 5:
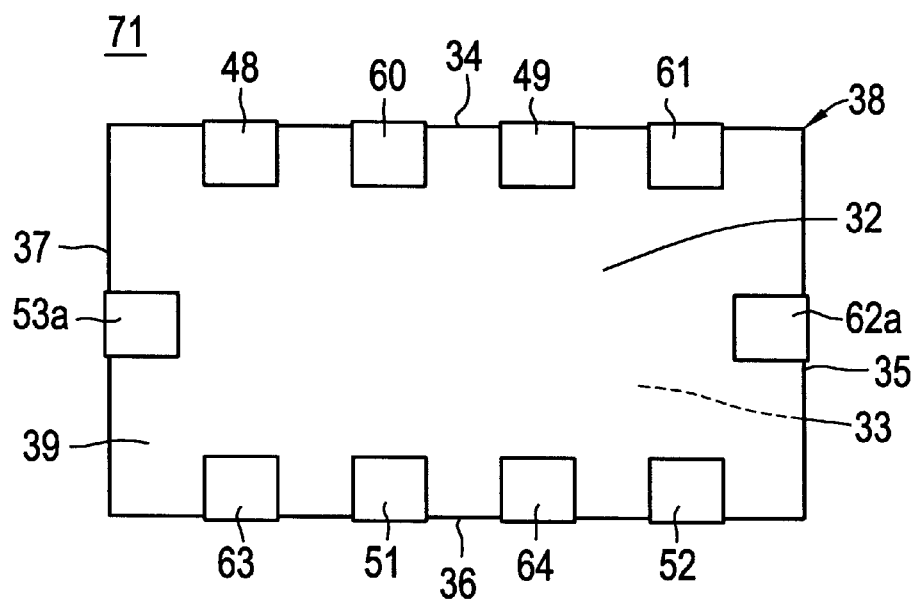
FIG. 5 is a plan view of a multi-layer capacitor 71 according to a second preferred embodiment of the invention showing the external appearance thereof.
Figure 6:
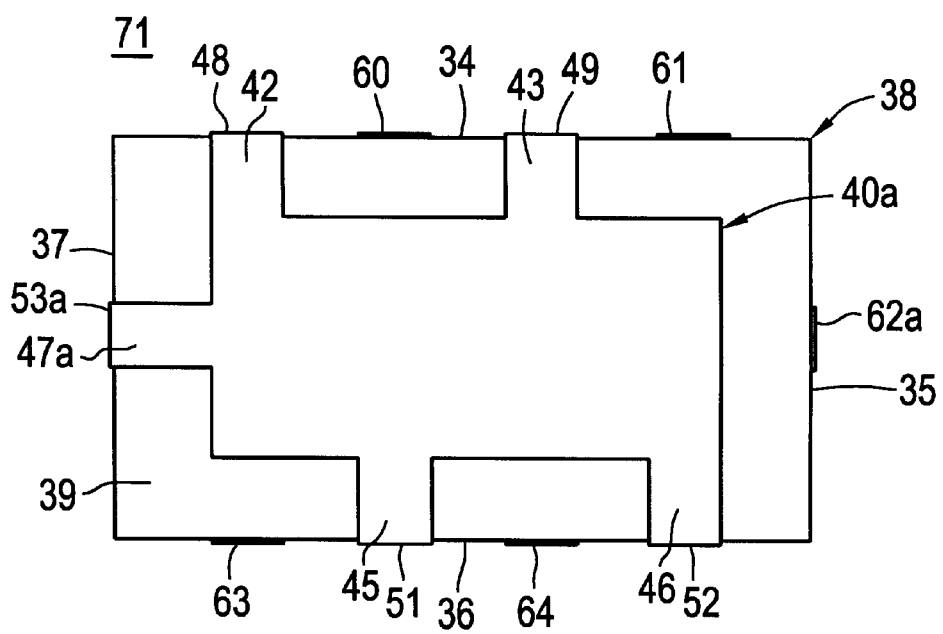
FIG. 6 is a plan view of the multi-layer capacitor 71 shown in FIG. 5 showing an internal structure thereof in the form of a section along which a first internal electrode 40a extends.
Figure 7:
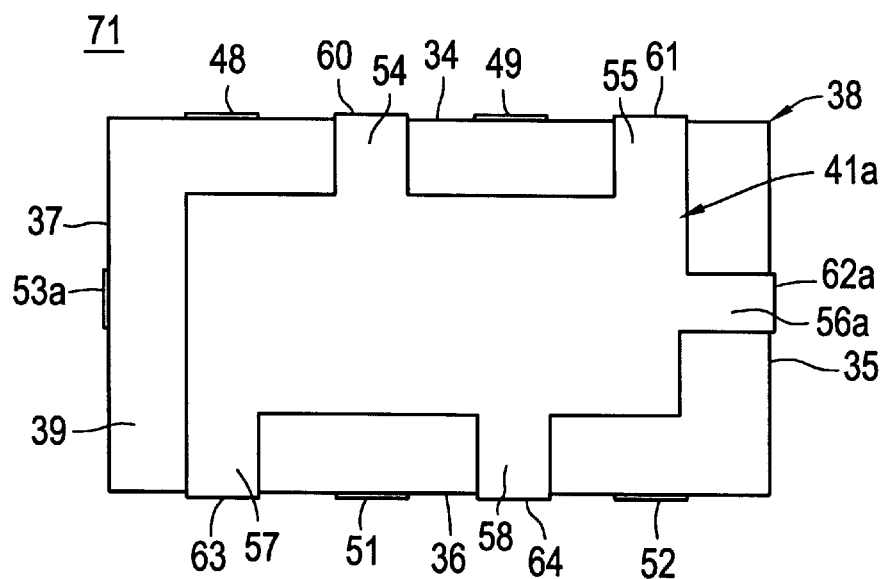
FIG. 7 is a plan view of the multi-layer capacitor 71 shown in FIG. 5 showing an internal structure thereof in the form of a section along which a second internal electrode 41a extends.

FIGS. 5 through 7 show a multi-layer capacitor 71 according to a second preferred embodiment of the present invention. FIG. 5 is a plan view of the external appearance of the multi-layer capacitor 71. FIG. 6 is a plan view showing one surface of an internal dielectric layer 39 of the multi-layer capacitor 71 having a first internal electrode 40a located thereon. FIG. 7 is a plan view showing one surface of a different one of the internal dielectric layers 39 of the multi-layer capacitor 71 having a second internal electrode 41a located thereon.

FIGS. 5 through 7 respectively correspond to FIGS. 1 through 3 of the first preferred embodiment. In FIGS. 5 through 7, elements corresponding to elements shown in FIGS. 1 through 3 are indicated by like reference numbers and will not be described here to avoid duplication.

Referring to FIG. 6, the first internal electrode 40a is formed with five lead electrodes 42, 43, 45, 46 and 47a which extend to respective side surfaces 34, 36 and 37. The multi-layer capacitor 71 is different from the multi-layer capacitor 31 of the first embodiment in that the multi-layer capacitor 71 has no lead electrode extending to side surface 35. Additionally, lead electrode 47a extends to the middle of the side surface 37, whereas lead electrode 47 extends to the upper half of side surface 37.

The five lead electrodes 42 through 47a are electrically coupled to five external terminal electrodes 48, 49, 51, 52 and 53a, respectively. The five external electrodes 48, 49, 51, 52 and 53a, are each located on one of the three side surfaces 34, 36 and 37. The multi-layer capacitor 71 is different from the multi-layer capacitor 31 of the first preferred embodiment in that the multi-layer capacitor 71 has no external terminal corresponding to the first external terminal electrode 50 and in that the external terminal electrode 53a is different in location from the external terminal electrode 53.

Referring to FIG. 7, a second internal electrode 41a has five lead electrodes 54, 55, 56a, 57 and 58 which extend to respective side surfaces 34 through 36. The multi-layer capacitor 71 is different from the multi-layer capacitor 31 of the first preferred embodiment in that it has no lead electrode extending to the side surface 37 and in that the lead electrode 56a which extends to the side surface 35 extends to the middle of the side surface 35, rather than the bottom of the side surface 35 as is the case with lead electrode 56 of the first preferred embodiment.

Each of the lead electrodes 54 through 58 is electrically coupled to a respective external terminal electrode 60, 61, 62a, 63 and 64. Each of these terminal electrodes are provided on a respective side surface 34 through 36. The multi-layer capacitor 71 is different from the multi-layer capacitor 31 of the first preferred embodiment in that it has no external terminal corresponding to the external terminal electrode 65 and in that the external terminal electrode 62a is located in a different position than the external terminal electrode 62.

If desired, the capacity of multi-layer capacitor 71 can be increased by providing a plurality of capacitive units, each defined by a respective set of internal electrodes 40a, 41a, separated by a respective dielectric layer 38. The plurality of capacitor units are then connected in parallel by appropriate ones of the external terminal electrodes 48 through 53a or 60 through 64.

In the second preferred embodiment of the invention, each of the external terminal electrodes 48, 49, 51 and 52 coupled to the first internal electrode 40a is located adjacent to at least one of the external terminal electrodes 60, 61, 63 and 64 coupled to internal electrode 41a. Further, only the second external terminal electrode 62a is located on the side surface 35, and only the first external terminal electrode 53a is located on the side surface 37. By providing the external terminal electrodes 62a and 53a on the side surfaces 35 and 37, respectively, it is possible to direct the flow of the currents on the internal electrodes 40a and 41a in various directions to achieve a level of cancellation of magnetic flux that is higher than that which is achievable in the conventional multi-layer capacitor 1 shown in FIGS. 15 through 17. It is also possible to reduce the length of the path of these currents thereby further reducing the induced inductance components.

Third Preferred Embodiment

Figure 8:
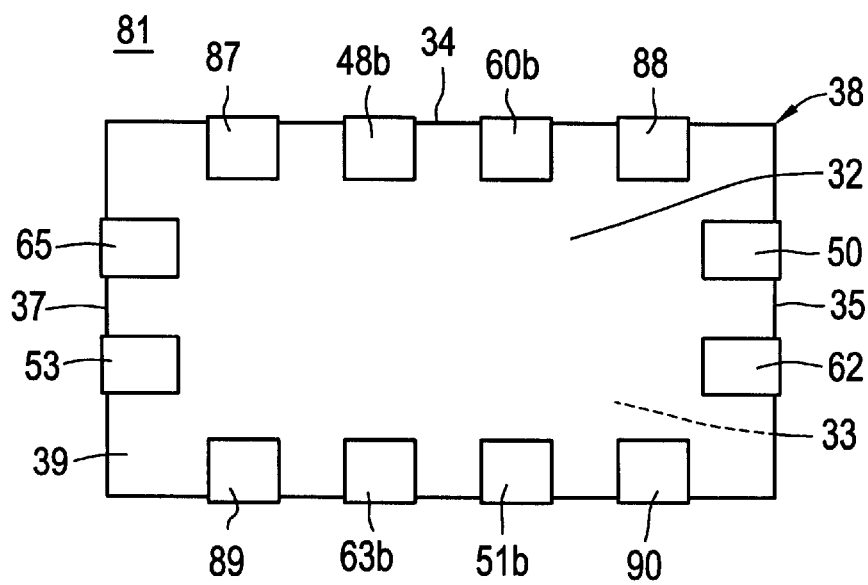
FIG. 8 is a plan view of a multi-layer capacitor 81 according to a third preferred embodiment of the invention showing the external appearance thereof.
Figure 9:
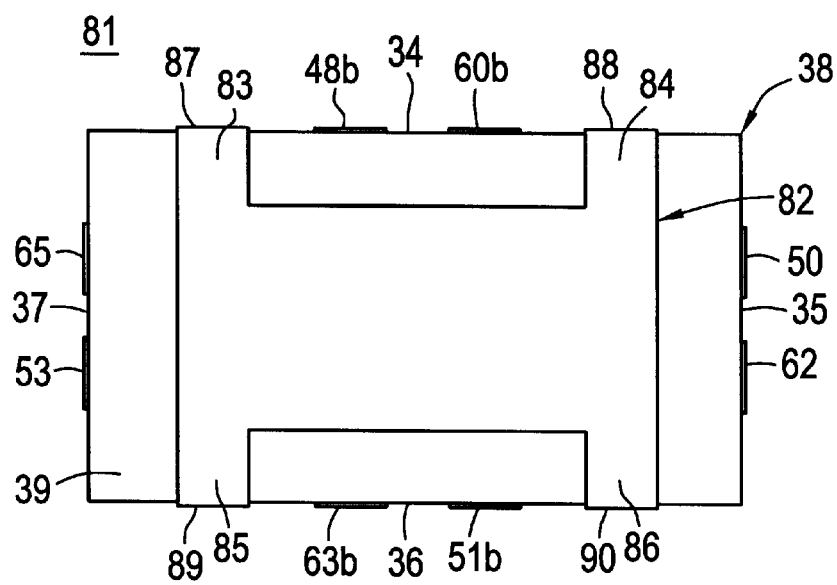
FIG. 9 is a plan view of the multi-layer capacitor 81 shown in FIG. 8 showing an internal structure thereof in the form of a section along which a third internal electrode 82 extends.
Figure 10:
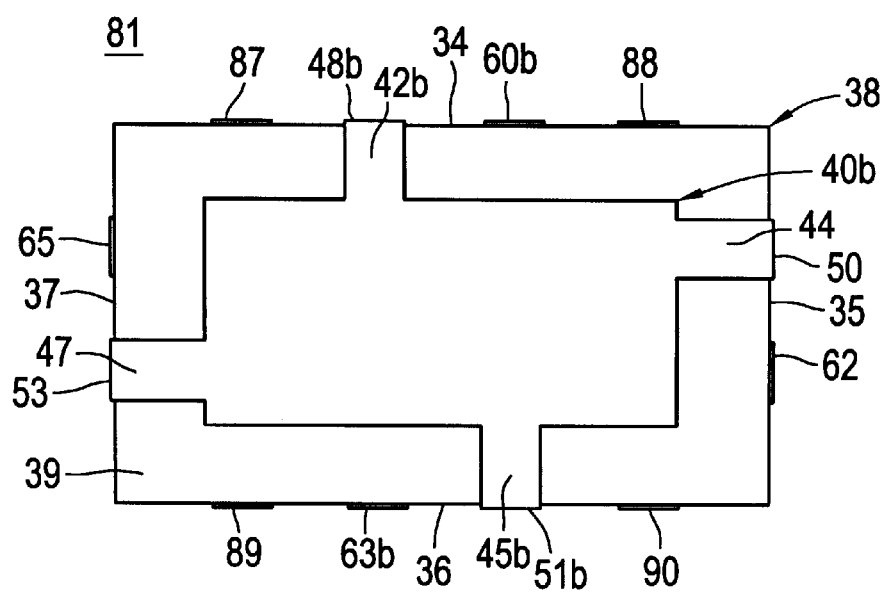
FIG. 10 is a plan view of the multi-layer capacitor 81 shown in FIG. 8 showing an internal structure thereof in the form of a section along which a first internal electrode 40b extends.
Figure 11:
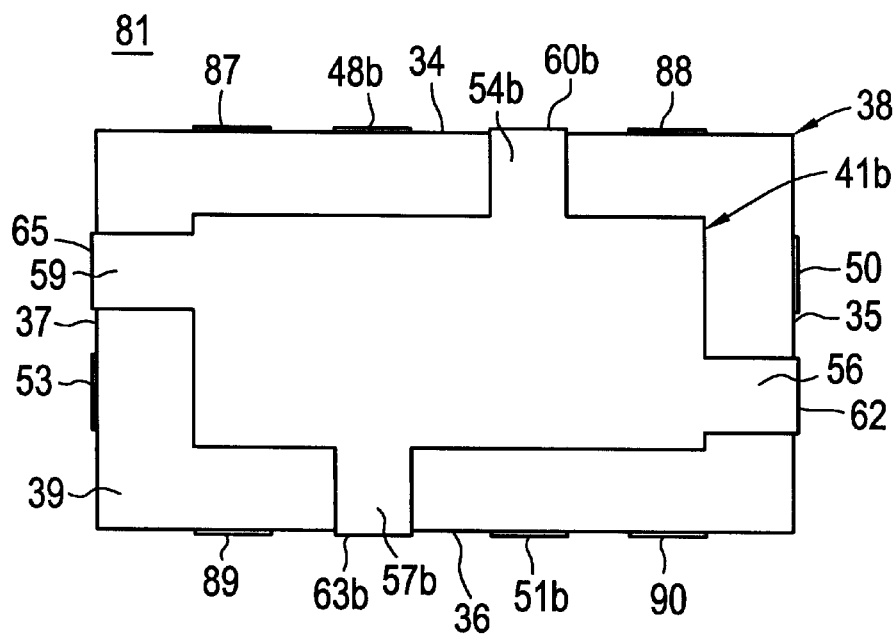
FIG. 11 is a plan view of the multi-layer capacitor 81 shown in FIG. 8 showing an internal structure thereof in the form of a section along which a second internal electrode 41b extends.

FIGS. 8 through 11 show a multi-layer capacitor 81 according to a third preferred embodiment of the present invention. FIG. 8 is a plan view of the external appearance of the multi-layer capacitor 81. FIG. 9 is a plan view of the surface of one of the internal dielectric layers 39 of the multi-layer capacitor 81 having a first internal electrode 82 formed thereon. FIG. 10 is a plan view of the surface of one of the internal dielectric layers 39 of the multi-layer capacitor 81 having a second internal electrode 40b formed thereon. FIG. 11 is a plan view of the surface of one of the internal dielectric layers 39 of the multi-layer capacitor 81 having a third internal electrode 41b formed thereon.

In FIGS. 8 through 11, elements corresponding to elements shown in FIGS. 1 through 3 are indicated by like reference numbers and will not be described here to avoid duplication.

The multi-layer capacitor 81 of the third preferred embodiment of the invention includes a third internal electrode 82 facing at least either the first internal electrode 40b or second internal electrode 41b with a dielectric material layer 39 interposed therebetween. The third internal electrode 82 is formed with four lead electrodes 83, 84, 85 and 86, each of which extends to a respective side surface 34 and 36. More specifically, lead electrodes 83 and 84 extend to side surface 34, and lead electrodes 85 and 86 extend to side surface 36.

External terminal electrodes 87, 88, 89 and 90, which are electrically coupled to the lead electrodes 83 through 86, respectively, are provided on respective side surfaces 34 and 36. The multi-layer capacitor 81 is different from the multi-layer capacitor 31 of the first preferred embodiment in that it includes the third external terminal electrodes 87 and 90 provided, respectively, in the positions where the first external terminal electrodes 48 and 52 are provided on the multi-layer capacitor 31 of the first embodiment and includes the third external terminal electrodes 88 and 89 provided respectively in the positions where the second external terminal electrodes 61 and 63 are provided on the multi-layer capacitor 31.

Referring to FIG. 10, a first internal electrode 40b has four first lead electrodes 42b, 44, 45b and 47 which extend to respective side surfaces 34 through 37. The first internal electrode 40b of the multi-layer capacitor 81 is different from the multi-layer capacitor 31 of the first embodiment in that it has only one lead electrode 42b which extends to side surface 34 and one lead electrode 45b which extends to side surface 36.

Four first external terminal electrodes 48b, 50, 51b and 53 are electrically coupled to the four first lead electrodes 42b through 47, respectively, and are provided on the four side surfaces 34 through 37, respectively. The multi-layer capacitor 81 is different from the multi-layer capacitor 31 of the first preferred embodiment in that it includes the first external terminal electrodes 48b and 51b provided respectively in the positions where the second external terminal electrodes 60 and 64 are provided on the multi-layer capacitor 31.

Referring to FIG. 11, a second internal electrode 41b has four second lead electrodes 54b, 56, 57b and 59 which extend to respective side surfaces 34 through 37. The second internal electrode of the multi-layer capacitor 81 is different from the second internal electrode 41 of the multi-layer capacitor 31 of the first preferred embodiment in that only one lead electrode 54b extends to the side surface 34 and only one lead electrode 57b extends to side surface 36.

Four second external terminal electrodes 60b, 62, 63b and 65 are electrically coupled to the four first lead electrodes 54b through 59, respectively. The four second external terminal electrodes are provided on the four side surfaces 34 through 37, respectively. The multi-layer capacitor 81 is different from the multi-layer capacitor 31 of the first preferred embodiment in that the second external terminal electrodes 60b and 63b provided, respectively, in the positions where the first external terminal electrodes 49 and 51 are provided on the multi-layer capacitor 31.

By way of example, the multi-layer capacitor 81 can be formed by locating the third internal electrode 82, the first internal electrode 40b and the second internal electrode 41b, one above the other with respective dielectric layers being located therebetween. Irrespective of the relative locations of the internal electrodes, the external terminal electrodes are arranged such that each of the third external terminal electrodes 87 through 90 is followed by one of the first external terminal electrodes 48b through 53 and then followed by one of the second external terminal electrodes 60b through 65. This alternating arrangement is repeated throughout the four side surfaces 34 through 37. The above-described order of stacking the internal electrodes 82, 40b and 41b may be changed arbitrarily.

In order to increase the capacity of the multi-layer capacitor 81, a plurality of third internal electrodes 82, first internal electrodes 40b and second internal electrodes 41b may be provided to form a plurality of capacitor units. For example, a plurality of third internal electrodes 82 and a plurality of first internal electrodes 40b may be provided; a plurality of second internal electrodes 41b and a plurality of third internal electrodes 82 may be provided; or a plurality of third internal electrodes 82, a plurality of first internal electrodes 40b and a plurality of second internal electrodes 41b may be provided. The resultant capacitor units are connected in parallel by at least any of the third external terminal electrodes 87 through 90, the first external terminal electrodes 48b through 53 and the second external terminal electrodes 60b through 65.

Like the first preferred embodiment, external terminal electrodes connected to different internal electrodes (that is, external terminal electrodes having different polarities) are located on each of the four side surfaces 34 through 37. More specifically, first external terminal electrode 48b, second external terminal electrode 60b and third external terminal electrodes 87 and 88 are located on the side surface 34; first external terminal electrode 50 and second external terminal electrode 62 are located on side surface 35; first external terminal electrode 51b, second external terminal electrode 63b and third external terminal electrodes 85 and 90 are located on side surface 36; and first external terminal electrode 53 and second external terminal electrode 65 are located on side surface 37.

Therefore, according to the third preferred embodiment of the invention, since the flow of currents on the internal electrodes 40b and 41b can be directed in various directions to effectively cancel magnetic flux and to reduce the lengths of the current paths, the induced inductance components can be reduced.

Figure 15:
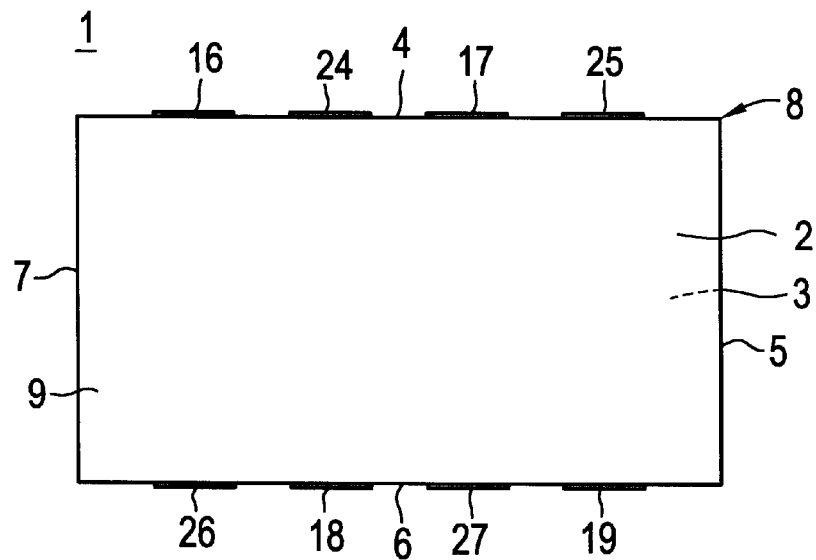
FIG. 15 is a plan view of a conventional multi-layer capacitor 1 which is of interest to the present invention showing the external appearance thereof.
Figure 16:
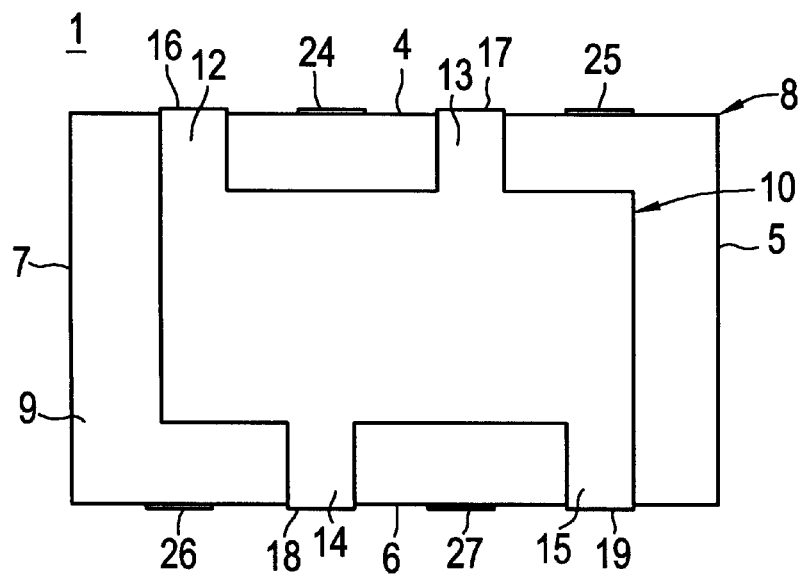
FIG. 16 is a plan view of the multi-layer capacitor 1 shown in FIG. 15 showing an internal structure thereof in the form of a section along which a first internal electrode 10 extends.
Figure 17:
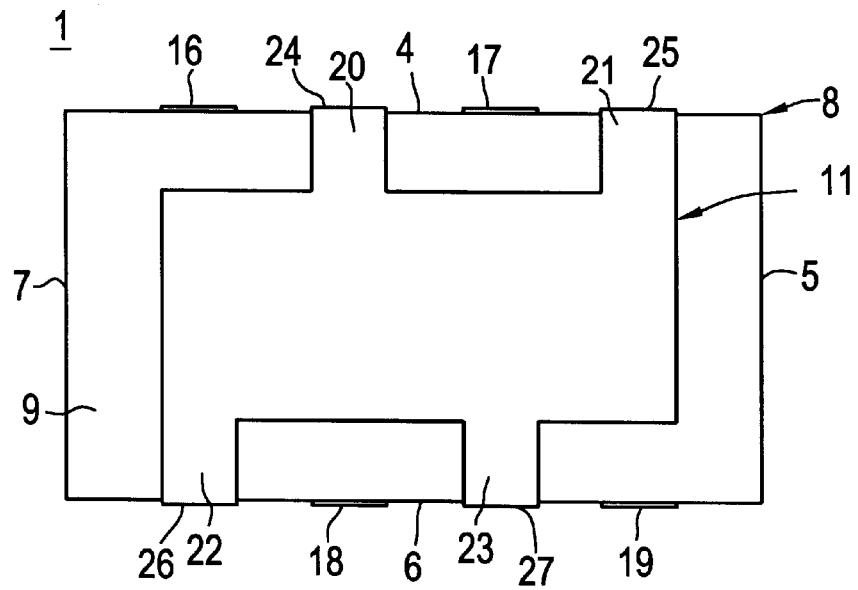
FIG. 17 is a plan view of the multi-layer capacitor 1 shown in FIG. 15 showing an internal structure thereof in the form of a section along which a second internal electrode 11 extends.

Although the arrangement of the third preferred embodiment is different from that in the first preferred embodiment in that external terminal electrodes having different polarities are not necessarily adjacent to each other in all locations, the directions of the current flows on the internal electrodes 40b and 41b is more diverse than those in the conventional multi-layer capacitor 1 shown in FIGS. 15 through 17 and the lengths of the current paths are shorter. This makes it possible to achieve a higher reduction of the induced inductance components.

As an alternative to the third preferred embodiment, a multi-layer capacitor may be provided in which only the first and second internal electrodes 40b and 41b are provided and the third internal electrode 82 is excluded. Further, the third internal electrode 82 may be formed with lead electrodes which extend to the side surfaces 35 and 37.

Fourth Preferred Embodiment

Figure 12:
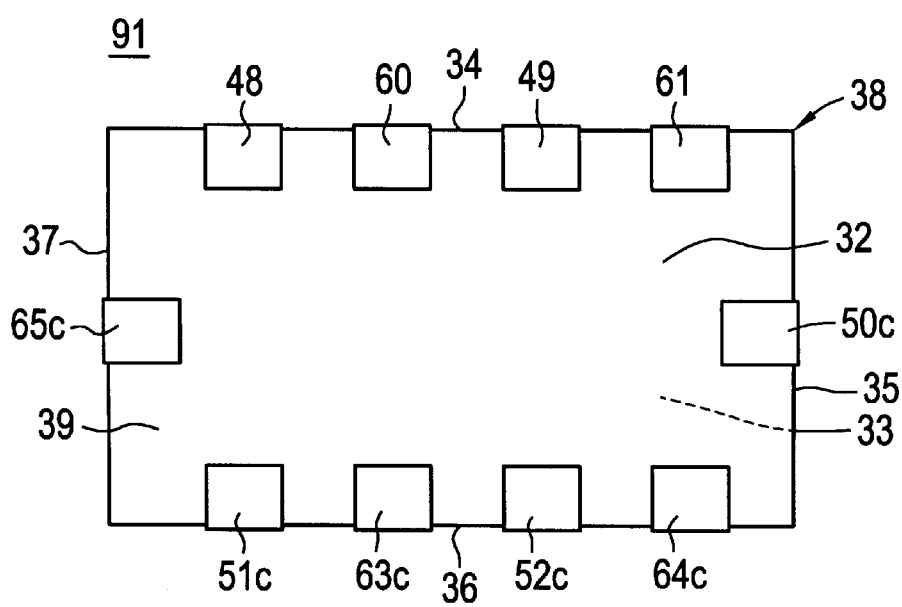
FIG. 12 is a plan view of a multi-layer capacitor 91 according to a fourth preferred embodiment of the invention showing the external appearance thereof.
Figure 13:
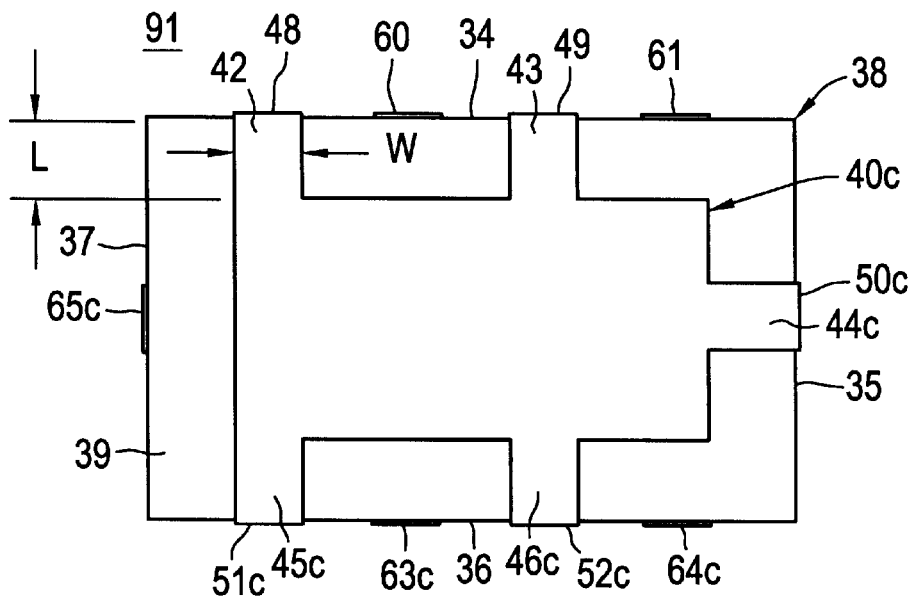
FIG. 13 is a plan view of the multi-layer capacitor 91 shown in FIG. 12 showing an internal structure thereof in the form of a section along which a first internal electrode 40c extends.
Figure 14:
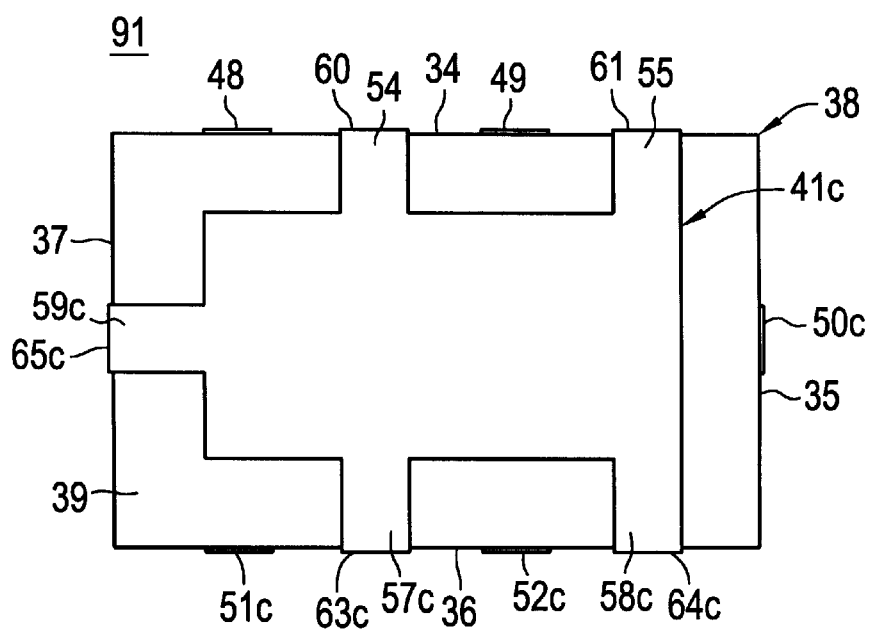
FIG. 14 is a plan view of the multi-layer capacitor 91 shown in FIG. 12 showing an internal structure thereof in the form of a section along which a second internal electrode 41c extends.

FIGS. 12 through 14 show a multi-layer capacitor 91 according to a fourth preferred embodiment of the present invention. FIG. 12 is a plan view of the external appearance of the multi-layer capacitor 91. FIG. 13 is a plan view of the surface of one of the dielectric layers of the multi-layer capacitor 91 having a first internal electrode 40c formed thereon. FIG. 14 is a plan view of the surface of one of the dielectric layers of the multi-layer capacitor 91 having a second internal electrode 41c formed thereon.

FIGS. 12 through 14 respectively correspond to FIGS. 1 through 3 of the first preferred embodiment. In FIGS. 12 through 14, elements corresponding to elements shown in FIGS. 1 through 3 are indicated by like reference numbers and will not be described here to avoid duplication.

The multi-layer capacitor 91 of the fourth preferred embodiment of the invention resembles the multi-layer capacitor 71 of the second embodiment in its external appearance. A first internal electrode 40c has five first lead electrodes 42, 43, 44c, 45c and 46c which extend to respective side surfaces 34, 35 and 36. The multi-layer capacitor 91 is different from the multi-layer capacitor 31 of the first preferred embodiment in that does not include a lead electrode corresponding to the lead electrode 47 which extends to the side surface 37 and in that the positions at which the lead electrodes 44c, 45c and 46c respectively extends to the side surfaces 35 and 36 are different from the positions that the lead electrodes 44 through 46 extend to those surfaces.

Five external terminal electrodes 48, 49, 50c, 51c and 52c are electrically coupled to the five lead electrodes 42 through 46c, respectively. These external electrodes are provided on the side surfaces 34 through 36. The multi-layer capacitor 91 is different from the multi-layer capacitor 31 of the first preferred embodiment in that it does not include an external terminal electrode corresponding to the first external terminal electrode 53 and in that the positions of the external terminal electrodes 50c, 51c and 52c are different from the positions of the external terminal electrodes 50 through 52, respectively.

Referring to FIG. 14, a second internal electrode 41c has five lead electrodes 54, 55, 57c, 58c and 59c, each of which extends to a respective side surfaces 34, 36 and 37. The multi-layer capacitor 91 is different from the multi-layer capacitor 31 of the first preferred embodiment in that it does not include a lead electrode corresponding to the lead electrode 59 which extends to the side surface 35 and in that the positions of the lead electrodes 57c, 58c and 59c are different from the positions of the lead electrodes 57 through 59, respectively.

The external terminal electrodes 60, 61, 63c, 64c and 65c which are electrically coupled to second lead electrodes 54 through 59c, respectively, are provided on the side surfaces 34, 36 and 37. The multi-layer capacitor 91 is different from the multi-layer capacitor 31 of the first preferred embodiment in that it does not include an external terminal electrode corresponding to the second external terminal electrode 62 and in that the positions of the external terminal electrodes 63c, 64c and 65c are different from the positions of the external terminal electrodes 63 through 65, respectively.

In order to increase the capacity of multi-layer capacitor 91, a plurality of first internal electrodes 40c and a plurality of second internal electrodes 41c can be provided. Pairs of internal electrodes 40c, 41c will face one another with a dielectric layer formed therebetween so as to form respective capacitor units. These capacitor units will be connected in parallel by at least either the first external terminal electrodes 48 through 52c or the second external terminal electrodes 60 through 65c.

Like the first preferred embodiment described above, each of the first external terminal electrodes 48 through 52c of the fourth preferred embodiment of the invention is arranged so as to alternate with respective ones of the second external terminal electrodes 60 through 65c throughout the four side surfaces 34 through 37. The fourth preferred embodiment is different from the second preferred embodiment in this regard.

Therefore, according to the fourth preferred embodiment of the invention, since the flow of currents on the internal electrodes 40c and 41c can be directed in various directions, the various components of induced magnetic flux will be cancelled and the lengths of the current paths will be shortened relative to the prior art of FIGS. 15–17. The fourth preferred embodiment will effectively reduce the induced inductance components to a degree which is similar to that of the first preferred embodiment.

In relation to additional features and advantages of the fourth preferred embodiment, the inventors discovered that variations in dimensions and relationships between such dimensions of the lead electrodes materially affect the ESL of the capacitors of the fourth preferred embodiment and each of other preferred embodiments described herein. These further features and advantages described in the following paragraphs are shown as being incorporated in the fourth preferred embodiment of FIGS. 12–14 but can be applied and incorporated in any of the preferred embodiments disclosed herein.

More specifically, the length and the width of a lead-out portion are designated by reference characters L, W in FIG. 13, for example. In each of the above-described preferred embodiments, currents in the main portions of the first internal electrodes and the second internal electrodes flow in different directions, so that the generation of a magnetic flux is prevented. However, in the respective lead electrodes, currents flow in a uniform direction. Therefore, a magnetic flux is generated, and an inductance is generated in accordance with the magnetic flux. Further, the state of currents flowing in the respective main portions of the first internal electrodes and the second internal electrodes is changed, depending on the lengths and the widths of the lead electrodes. Accordingly, the lengths and the widths of the lead electrodes significantly affect the ESL value of the capacitor.

To confirm the discovery described above, the lengths L and the widths W of all of the lead electrodes were varied in a multi-layer capacitor 91 according to a fourth preferred embodiment as shown in FIGS. 12 through 14. The capacitor 91 preferably includes a total of 10 lead electrodes, for example, in which four lead electrodes 42, 43, 54, 55 and four lead electrodes 45c, 46c, 57c, 58c are extended onto the side surfaces 34, 36, respectively, and moreover, and one lead electrode 44c and one lead electrode 59c are extended onto the side surfaces 35, 37, correspondingly. TABLE 1 shows the results.

TABLE 1

|            | L = 0.1 mm | L = 0.2 mm | L = 0.3 mm | L = 0.5 mm |
|------------|------------|------------|------------|------------|
| W = 0.08 mm | 38 pH     | 65 pH      | 87 pH      | 106 pH     |
| W = 0.16 mm | 28 pH     | 35 pH      | 50 pH      | 81 pH      |
| W = 0.24 mm | 25 pH     | 32 pH      | 39 pH      | 58 pH      |

The numerical values listed in TABLE 1 are measurement values of the ESL obtained by a conventional publicly-known resonance method. As seen in the results, in the capacitors having plural lead electrodes, the ESL value is changed according to the ratio of L/W. When the ratio L/W of the capacitors is about 3 or lower, the ESL value is less than about 80 pH. When the ratio L/W is about 1.3 or lower, the ESL value is less than about 40 pH.

In the above-described preferred embodiments, the widths of all of the plural lead electrodes are preferably substantially equal to each other. However, the above-described preferred range of the L/W value can be applied to capacitors having the structure in which the width of at least one of the lead electrodes is different from that of the respective remaining lead electrode(s). For example, this will be described in reference to FIGS. 13 and 14. The above-described preferred range of the L/W value can be applied to capacitors each having the structure in which the widths of one lead electrode 44c and one lead electrode 59c extending onto the side surfaces 35, 37, correspondingly, are wider as compared with four lead electrodes 42, 43, 54, 55 and four lead electrodes 45c, 46c, 57c, 58c extending onto the side surfaces 34, 36, respectively.

According to another preferred embodiment, a capacitor structure is similar to that of the multi-layer capacitor 91 according to the fourth preferred embodiment as shown in FIGS. 12 through 14, except that the lead electrodes 44c, 59c are not provided. The lengths L and the widths W of all the lead electrodes of this preferred embodiment were also varied to provide further confirmation of the discovery with respect to the ratio L/W described above. In this capacitor, four lead electrodes are preferably extended onto the side surfaces 34, 36, respectively. That is, the capacitor has a total of 8 lead electrodes, for example. TABLE 2 shows the results.

TABLE 2

|            | L = 0.1 mm | L = 0.2 mm | L = 0.3 mm | L = 0.5 mm |
|------------|------------|------------|------------|------------|
| W = 0.08 mm | 79 pH     | 107 pH     | 131 pH     | 176 pH     |
| W = 0.16 mm | 68 pH     | 76 pH      | 95 pH      | 133 pH     |
| W = 0.24 mm | 55 pH     | 66 pH      | 77 pH      | 106 pH     |

The numerical values in TABLE 2 are measurement values of ESL obtained by a conventional publicly-known resonance method. In this capacitor, when the ratio L/W is about 3 or lower, the ESL value is about 120 pH or lower. When the ratio L/W is about 1.3 or lower, the ESL value is about 80 pH or lower. For the prior art structure described in the specification of this application, the same results are obtained.

In the above preferred embodiment, the widths of all the lead electrodes are preferably made substantially equal to each other. However, the above-described preferred range of the ratio L/W value can be applied to capacitors having the structure in which the width of at least one of the lead electrodes is wider than that of the respective remaining lead electrodes.

In recently developed microprocessing units (MPU), the operating frequency of nearly 1 GHz is to be used. Such an MPU contains an MPU chip and a capacitor. Capacitors combined with the MPU chip are required to have an ESL value of less than about 10 pH. If one capacitor can not satisfy the requirement, plural capacitors are connected in parallel. For the purpose of reducing an inductance component caused by the wiring being short-circuited between the plural capacitors and the MPU chip, the capacitors are arranged close to the four sides of the MPU chip. In the case that the total ESL value of the plurality of capacitors is less than about 10 pH, and one capacitor is arranged on each of the four sides of the MPU chip, it is required to provide capacitors each having an ESL value of less than about 40 pH. When two capacitors are arranged on each of the four sides of the MPU chip, it is required for each capacitor to have an ESL value of less than about 80 pH. When three capacitors are arranged on each of the four sides of a MPU chip, it is required for each capacitor to have an ESL value of less than about 120 pH. The L/W values which have been included in the above preferred embodiment are significant for providing capacitors satisfying such a requirement.

Accordingly, in preferred embodiments of the present invention, when the ratio L/W is about 3 or lower, low ESL capacitors which are practically useful can be obtained. Preferably, the ratio L/W is about 1.3 or lower. In general, when lead electrodes are widened, currents can flow smoothly from the portions of capacitors where charges are accumulated, that is, the respective main portions of the first internal electrodes and the second internal electrodes into the lead electrodes. However, preferably, the ratio L/W is about 0.4 or higher because when the ratio L/W is less than about 0.4, the lengths of lead electrodes are short and/or the widths are wide, and therefore, deterioration of the electrical insulation and moisture-proof properties occurs.

Further, another preferred embodiment is arranged such that the outside dimensions of all of the first internal electrodes and all of the second internal electrodes are preferably substantially equal to each other, and the lengths of all the lead electrodes are preferably substantially equal to each other. In this preferred embodiment, the lengths of all of the lead electrodes are preferably substantially equal, and moreover can be reduced as much as possible. The static capacitance can be also made as large as possible.

On the other hand, when the outside dimensions of the first internal electrodes are smaller than those of the second internal electrodes, for example, the lengths of the lead electrodes connected to the first internal electrodes become relatively longer as compared with those of the second internal electrodes. Then, the ESL value is increased, as compared with that in the preferred embodiments of the present application. In other words, the capacitors of the preferred embodiments of this application have a much lower ESL value than capacitors having the structure in which the outside dimensions of the first internal electrodes and those of the second internal electrodes are different from each other.

Fifth Preferred Embodiment

Figure 19:
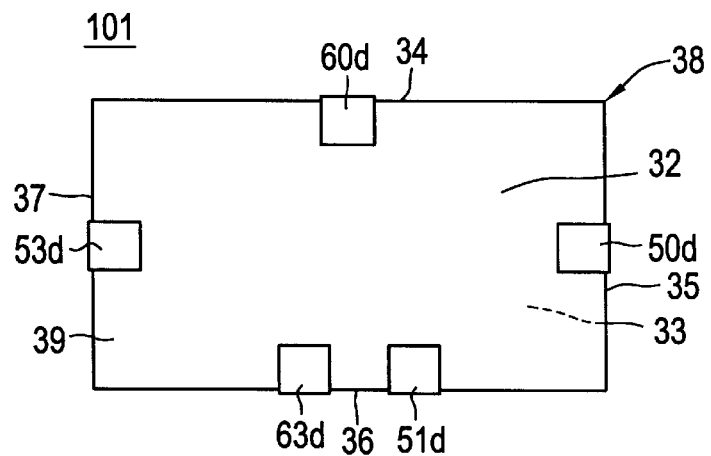
FIG. 19 is a plan view of a multi-layer capacitor 101 according to a fifth preferred embodiment of the present invention.
Figure 20:
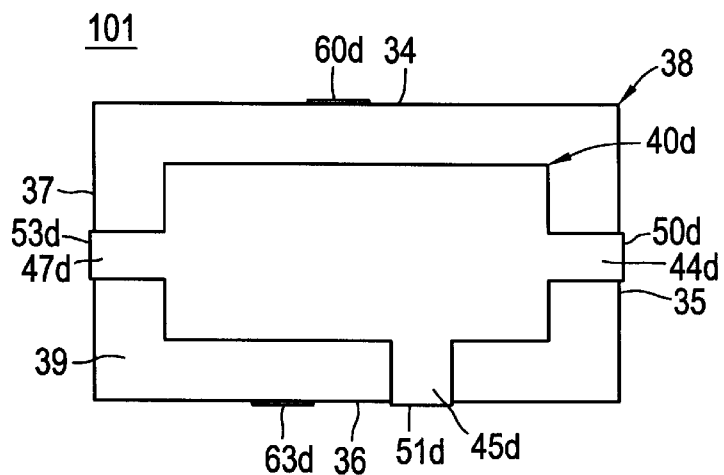
FIG. 20 is a plan view of the multi-layer capacitor 101 shown in FIG. 19 showing an internal structure thereof in the form of a section along which a first internal electrode 40d extends.
Figure 21:
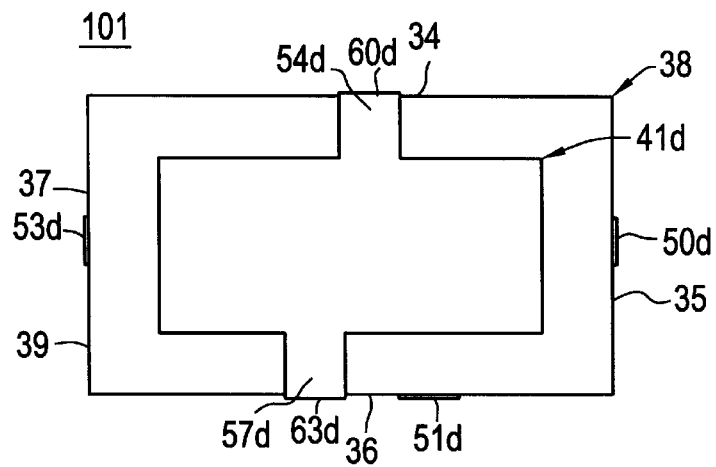
FIG. 21 is a plan view of the multi-layer capacitor 101 shown in FIG. 10 showing an internal structure thereof in the form of a section along which a second internal electrode 41d extends.

FIGS. 19 through 21 show a multi-layer capacitor 101 according to a fifth preferred embodiment of the present invention. FIG. 19 is a plan view of the external appearance of the multi-layer capacitor 101. FIG. 20 is a plan view of the surface of one of the dielectric layers of the multi-layer capacitor 101 having a first internal electrode 40d formed thereon. FIG. 21 is a plan view of the surface of one of the dielectric layers of the multi-layer capacitor 101 having a second internal electrode 41d formed thereon.

FIGS. 19 through 21 respectively correspond to FIGS. 1 through 3 of the first preferred embodiment. In FIGS. 19 through 21, elements corresponding to elements shown in FIGS. 1 through 3 are indicated by like reference numbers and will not be described here to avoid duplication.

Referring to FIG. 20, a first internal electrode 40d has three first lead electrodes 44d, 45d and 47d which extend to respective side surfaces 35, 36 and 37. The multi-layer capacitor 101 is different from the multi-layer capacitor 31 of the first preferred embodiment in that it does not include lead electrodes 42 and 43 which extend to the side surface 34, does not include a lead electrode 46 which extends to the side surface 36, and in that the positions at which the lead electrodes 44d, 45d, and 47d respectively extend to the side surfaces 35, 36 and 37 are different from the positions that the lead electrodes 44, 45 and 47 extend to those surfaces.

The three lead electrodes 44d, 45d and 47d are electrically coupled to three external terminal electrodes 50d, 51d and 53d respectively. These external terminal electrodes are provided on the side surfaces 35 through 37. The multi-layer capacitor 101 is different from the multi-layer 31 of the first preferred embodiment in that it does not include external terminal electrodes corresponding to the first external terminal electrodes 48, 49 and 52 in that the positions of the external terminal electrodes 50d, 51d and 53d are different from the positions of the external terminal electrodes 50, 51 and 53, respectively.

Referring to FIG. 21, a second internal electrode 41d has two lead electrodes 54d and 57d, each of which extends to respective side surfaces 34 and 36. The multi-layer capacitor 101 is different from the multi-layer capacitor 31 of the first preferred embodiment in that it does not include lead electrodes corresponding to the lead electrodes 61, 62, 64 and 65 which extends to the side surfaces 34 through 37, respectively, and in that the positions of the lead electrodes 54d and 57d are different from the positions of the lead electrodes 54 and 57, respectively.

Two external terminal electrodes 60d and 63d are electrically coupled to the two lead electrodes 54d and 57d, respectively, and are provided on the side surfaces 34 and 36. The multi-layer capacitor is different from the multi-layer capacitor 31 of the first preferred embodiment in that it does not include external terminal electrodes corresponding to the second external terminal electrodes 61, 62, 64 and 65, and in that the positions of the external terminal electrodes 60d and 63d are different from the positions of the external terminal electrodes 60 and 63, respectively.

In order to increase the capacity of multi-layer capacitor 101, a plurality of first internal electrodes 40d and a plurality of second internal electrodes 41d can be provided. Therefore, according to the fifth preferred embodiment of the invention, since the flow of the currents on the internal electrodes 40b and 41b can be directed in various directions to effectively cancel magnetic flux and to reduce the lengths of the current paths, the induced inductance components can be reduced.

Although the arrangement of the fifth preferred embodiment is different from that in that first preferred embodiment in that external terminal electrodes having different polarities are not necessarily adjacent to each other in all locations the directions of the current flows on the internal electrodes 40d and 41d is more diverse that those in the conventional multi-layer capacitor 1 shown in FIGS. 15 and 17 and the lengths of the current paths are shorter. Therefore, this makes it possible to achieve a higher reduction of the induced inductance components.

Test Results

A sample of each of the multi-layer capacitor 31 according to the first preferred embodiment (preferred embodiment 1), the multi-layer capacitor 71 according to the second preferred embodiment (preferred embodiment 2), the multi-layer capacitor 81 according to the third preferred embodiment (preferred embodiment 3), the multi-layer capacitor 91 according to the fourth preferred embodiment (preferred embodiment 4) and the conventional multi-layer capacitor 1 (comparative example) was fabricated and ESL of each of them was evaluated.

Each sample was formed with outer plan dimensions of 3.2 mm×2.5 mm. For samples having six layers of internal electrodes in total, i.e., those having two kinds of internal electrodes such as the multi-layer capacitors 31, 71, 91 and 1 (embodiments 1, 2 and 4 and comparative example), the stacking of the two kinds of internal electrodes was repeated three times (i.e., three pairs of internal electrodes where used to form three capacitance units). For the sample having three kinds of internal electrodes, i.e., the multi-layer capacitor 81 (preferred embodiment 3), the stacking of the three kinds of internal electrodes was repeated twice.

ESL was obtained using the resonance method. The resonance method is a method wherein the impedance frequency characteristics of each of the sample multi-layer capacitor is measured and ESL is obtained from a frequency $f_o$ at a minimum point (referred to as series resonance point between the capacity component $C_s$ and ESL of the capacitor) using the following equation.

$$ESL = 1/[(2\pi f_o)^2 \times C_s]$$

The measured value of ESL of each sample is shown in the Table 3 below.

TABLE 3

| | ESL Value (pH) |
|---|---|
| Embodiment 1 | 40 |
| Embodiment 2 | 72 |
| Embodiment 3 | 85 |
| Embodiment 4 | 51 |
| Comparative Example | 95 |

It is apparent from Tables 1–3 that ESL was suppressed to a greater degree in the examples of preferred embodiment 4, especially those in Table 1. Also, preferred embodiment 1 produced lower ESL values than the examples in Table 2 of preferred embodiment 4 and than the preferred embodiments 2 and 3.

While the present invention has been described with reference to the illustrated preferred embodiments, for example, it is possible to change positions and the number of the lead-out electrodes of the internal electrodes variously and to change the positions and number of the external terminal electrodes accordingly within the scope of the invention.

As described above, according to the preferred embodiments of the present invention, at least either a first or a second internal electrode is formed with at least three lead electrodes which extend respectively to at least three of the side surfaces of a capacitor main body, and external terminal electrodes which are electrically coupled to respective lead electrodes are provided on respective side surfaces. As a result, since the flow of currents on the internal electrodes can be directed in various directions to cancel magnetic flux and to reduce the lengths of the currents path effectively, ESL can be reduced.

With this structure, a high resonance frequency can be achieved and the frequency band of the capacitor can be increased. Accordingly, a multi-layer capacitor according to the invention can accommodate electronic circuits at higher frequencies than was possible with the comparative example and can be advantageously used, for example, as a bypass capacitor or decoupling capacitor in a high frequency circuit. Further, while a decoupling capacitor used in an MPU (microprocessing unit) must also have the function of a quick power supply (a function of supplying power from an amount of electricity charged in the capacitor when there is a sudden need for power as in the case of power-up), a multi-layer capacitor according to the invention can be used for such an application because it has low ESL.

In the preferred embodiments of the present invention below, the cancellation of magnetic fluxes as described above is further improved and the lengths of currents are further reduced to achieve more effective reduction of ESL. It should be understood that the foregoing description is only illustrative of the invention. Various alternatives and modifications can be devised by those skilled in the art without departing from the invention. Accordingly, the present invention is intended to embrace all such alternatives, modifications and variances which fall within the scope of the appended claims.

What it is claimed is:

1. A multi-layer capacitor comprising:
a capacitor body having four sides including a first pair of opposed sides and a second pair of opposed sides, the capacitor body including a plurality of dielectric layers and at least a pair of first and second internal electrodes that oppose each other via one of the dielectric layers to define a capacitor unit, the first internal electrode having first lead-out portions, the second internal electrode having second lead-out portions, the first and second lead-out portions being arranged to interdigitate with each other;

first polarity external electrode terminals being electrically connected to the first lead-out portions, at least one of the first polarity external electrode terminals being arranged on each of the first pair of opposed sides and at least one of the first polarity external electrode terminals being arranged on each of the second pair of opposed sides of the capacitor body; and second polarity external electrode terminals being electrically connected to the second lead-out portions, at least one of the second polarity external electrode terminals being arranged on each of the first pair of opposed sides and at least one of the second polarity external electrode terminals being arranged on each of the second pair of opposed sides of the capacitor body;

at least one of the first or second lead-out portions of the first and second internal electrode have a length L and a width W and a ratio L/W is equal to about 3 or less.

2. The multi-layer capacitor according to claim 1, wherein the ratio L/W is equal to about 1.3 or less.

3. The multi-layer capacitor according to claim 1, wherein the ratio L/W is equal to about 0.4 or greater.

4. The multi-layer capacitor according to claim 1, wherein the ratio L/W is equal to or less than about 1.3 and greater than or equal to about 0.4.

5. The multi-layer capacitor according to claim 1, wherein the width W of at least one of the lead electrodes is different from that of the other lead electrodes.

6. The multi-layer capacitor according to claim 1, wherein lead electrodes are provided on each of a first pair of opposed sides of the capacitor body and a lead electrode is provided on each of a second pair of opposed sides of the capacitor body, and the width W of at least one of the lead electrodes provided on a respective one of the second pair of opposed sides of the capacitor body is wider than the lead electrodes disposed on each of the first pair of opposed sides of the capacitor body.

7. The multi-layer capacitor according to claim 1, wherein the lengths L of all of the lead electrodes are substantially equal to each other.

8. The multi-layer capacitor according to claim 1, wherein the four sides of the capacitor body include a pair of opposed longer sides and a pair of opposed shorter sides.

9. The multi-layer capacitor according to claim 1, wherein the capacitor body is substantially rectangular.

10. The multi-layer capacitor according to claim 1, wherein two of the first polarity external electrode terminals are provided on each of the first pair of opposed sides and two of the second polarity external electrode terminals are provided on each of the first pair of opposed sides.

11. The multi-layer capacitor according to claim 1, wherein each of the first polarity external electrode terminals is located adjacent to one of the second polarity external electrode terminals on each of the first pair of opposed sides of the capacitor body.

12. The multi-layer capacitor according to claim 1, wherein each of the first polarity external electrode terminals is located adjacent to one of the second polarity external electrode terminals on each of the second pair of opposed sides of the capacitor body.

13. The multi-layer capacitor according to claim 1, wherein each of the first polarity external electrode terminals is located directly opposite to one of the second polarity external electrode terminals across the capacitor body along the first pair of opposed sides of the capacitor body.

14. The multi-layer capacitor according to claim 1, wherein each of the first polarity external electrode terminals is located directly opposite to one of the second polarity external electrode terminals across the capacitor body along the second pair of opposed sides of the capacitor body.

15. The multi-layer capacitor according to claim 1, wherein a total number of the first polarity external electrode terminals and the second polarity external electrode terminals on each of the first pair of opposed sides and on each of the second pair of opposed sides is even.

16. The multi-layer capacitor according to claim 1, wherein a total number of the first polarity external electrode terminals and the second polarity external electrode terminals on a first of the first pair of opposed sides and on a second of the first pair of opposed sides is equal.

17. The multi-layer capacitor according to claim 1, wherein a total number of the first polarity external electrode terminals and the second polarity external electrode terminals on a first of the second pair of opposed sides and on a second of the second pair of opposed sides is equal.

18. A multi-layer capacitor according to claim 1, wherein the multi-layer capacitor is arranged to define a decoupling capacitor for a multiprocessing unit.

19. A high frequency circuit comprising at least one multi-layer capacitor according to claim 1.

20. The high frequency circuit according to claim 19, wherein the at least one multi-layer capacitor is arranged to define one of a bypass capacitor and a decoupling capacitor.

21. A wiring substrate comprising at least one multi-layer capacitor according to claim 1 mounted thereon.

22. A multi-layer capacitor comprising:
   a capacitor body having four sides including a first pair of opposed sides and a second pair of opposed sides, the capacitor body including a plurality of dielectric layers and at least a pair of first and second internal electrodes that oppose each other via one of the dielectric layers to define a capacitor unit, the first internal electrode having first lead-out portions, the second internal electrode having second lead-out portions, the first and second lead-out portions being arranged to interdigitate with each other;
   first polarity external electrode terminals being electrically connected to the first lead-out portions, at least two of the first polarity external electrode terminals being arranged on each of the first pair of opposed sides and at least one of the first polarity external electrode terminals being arranged on at least one of the second pair of opposed sides of the capacitor body; and
   second polarity external electrode terminals being electrically connected to the second lead-out portions, at least two of the second polarity external electrode terminals being arranged on each of the first pair of opposed sides and at least one of the second polarity external electrode terminals being arranged on at least one of the second pair of opposed sides of the capacitor body; wherein
      at least one of the first or second lead-out portions of the first and second internal electrode have a length L and a width W and a ratio L/W is equal to about 3 or less.

23. The multi-layer capacitor according to claim 22, wherein the ratio L/W is equal to about 1.3 or less.

24. The multi-layer capacitor according to claim 22, wherein the ratio L/W is equal to about 0.4 or greater.

25. The multi-layer capacitor according to claim 22, wherein the ratio L/W is equal to or less than about 1.3 and greater than or equal to about 0.4.

26. The multi-layer capacitor according to claim 22, wherein the width W of at least one of the lead electrodes is different from that of the other lead electrodes.

27. The multi-layer capacitor according to claim 22, wherein lead electrodes are provided on each of a first pair of opposed sides of the capacitor body and a lead electrode is provided on each of a second pair of opposed sides of the capacitor body, and the width W of at least one of the lead electrodes provided on a respective one of the second pair of opposed sides of the capacitor body is wider than the lead electrodes disposed on each of the first pair of opposed sides of the capacitor body.

28. The multi-layer capacitor according to claim 22, wherein the lengths L of all of the lead electrodes are substantially equal to each other.

29. The multi-layer capacitor according to claim 22, wherein the four sides of the capacitor body include a pair of opposed longer sides and a pair of opposed shorter sides.

30. The multi-layer capacitor according to claim 22, wherein the capacitor body is substantially rectangular.

31. The multi-layer capacitor according to claim 22, wherein two of the first polarity external electrode terminals are provided on each of the first pair of opposed sides and two of the second polarity external electrode terminals are provided on each of the first pair of opposed sides.

32. The multi-layer capacitor according to claim 22, wherein each of the first polarity external electrode terminals is located adjacent to one of the second polarity external electrode terminals on each of the first pair of opposed sides of the capacitor body.

33. The multi-layer capacitor according to claim 22, wherein each of the first polarity external electrode terminals is located adjacent to one of the second polarity external electrode terminals on each of the second pair of opposed sides of the capacitor body.

34. The multi-layer capacitor according to claim 22, wherein each of the first polarity external electrode terminals is located directly opposite to one of the second polarity external electrode terminals across the capacitor body along the first pair of opposed sides of the capacitor body.

35. The multi-layer capacitor according to claim 22, wherein each of the first polarity external electrode terminals is located directly opposite to one of the second polarity external electrode terminals across the capacitor body along the second pair of opposed sides of the capacitor body.

36. The multi-layer capacitor according to claim 22, wherein a total number of the first polarity external electrode terminals and the second polarity external electrode terminals on each of the first pair of opposed sides and on each of the second pair of opposed sides is even.

37. The multi-layer capacitor according to claim 22, wherein a total number of the first polarity external electrode terminals and the second polarity external electrode terminals on a first of the first pair of opposed sides and on a second of the first pair of opposed sides is equal.

38. The multi-layer capacitor according to claim 22, wherein a total number of the first polarity external electrode terminals and the second polarity external electrode terminals on a first of the second pair of opposed sides and on a second of the second pair of opposed sides is equal.

39. A multi-layer capacitor according to claim 22, wherein the multi-layer capacitor is arranged to define a decoupling capacitor for a multiprocessing unit.

40. A high frequency circuit comprising at least one multi-layer capacitor according to claim 22.

41. The high frequency circuit according to claim 40, wherein the at least one multi-layer capacitor is arranged to define one of a bypass capacitor and a decoupling capacitor.

42. A wiring substrate comprising at least one multi-layer capacitor according to claim 22 mounted thereon.

43. A multi-layer capacitor comprising:
a substantially rectangular capacitor body having four sides including a first pair of opposed longer sides and a second pair of opposed shorter sides, the capacitor body including a plurality of dielectric layers and at least a pair of first and second internal electrodes that oppose each other via one of the dielectric layers to define a capacitor unit, the first internal electrode having first lead-out portions, the second internal electrode having second lead-out portions, the first and second lead-out portions being arranged to interdigitate with each other;
first polarity external electrode terminals being electrically connected to the first lead-out portions, at least two of the first polarity external electrode terminals being arranged on each of the pair of opposed longer sides and at least one of the first polarity external electrode terminals being arranged on at least one of the pair of opposed shorter sides of the capacitor body; and
second polarity external electrode terminals being electrically connected to the second lead-out portions, at least two of the second polarity external electrode terminals being arranged on each of the pair of opposed longer sides and at least one of the second polarity external electrode terminals being arranged on at least one of the second pair of opposed sides of the capacitor body; wherein
one of the first polarity external electrode terminals is located on a first of the pair of opposed shorter sides of the capacitor body and the two external electrode terminals which are located closest to the one of the first polarity external electrode terminals are two of the second polarity external electrode terminals located on each of the pair of opposed longer sides of the capacitor body so as to be located on each side of the one of the first polarity external electrode terminals along an outer periphery of the capacitor body;
at least one of the first or second lead-out portion of the first and second internal electrode have a length L and a width W and a ratio L/W is equal to about 3 or less.

44. The multi-layer capacitor according to claim 43, wherein the ratio L/W is equal to about 1.3 or less.

45. The multi-layer capacitor according to claim 43, wherein the ratio L/W is equal to about 0.4 or greater.

46. The multi-layer capacitor according to claim 43, wherein the ratio L/W is equal to or less than about 1.3 and greater than or equal to about 0.4.

47. The multi-layer capacitor according to claim 43, wherein the width W of at least one of the lead electrodes is different from that of the other lead electrodes.

48. The multi-layer capacitor according to claim 43, wherein lead electrodes are provided on each of a first pair of opposed sides of the capacitor body and a lead electrode is provided on each of a second pair of opposed sides of the capacitor body, and the width W of at least one of the lead electrodes provided on a respective one of the second pair of opposed sides of the capacitor body is wider than the lead electrodes disposed on each of the first pair of opposed sides of the capacitor body.

49. The multi-layer capacitor according to claim 43, wherein the lengths L of all of the lead electrodes are substantially equal to each other.

50. The multi-layer capacitor according to claim 43, wherein one of the second polarity external electrode terminals is located on a second of the pair of opposed shorter sides of the capacitor body and the two external electrode terminals which are located closest to the one of the second polarity external electrode terminals are two of the first polarity external electrode terminals located on each of the pair of opposed longer sides of the capacitor body so as to be located on each side of the one of the second polarity external electrode terminals along an outer periphery of the capacitor body.

51. The multi-layer capacitor according to claim 43, wherein each of the first polarity external electrode terminals located on the pair of opposed longer sides are disposed directly opposite to each other across a width of the capacitor body.

52. The multi-layer capacitor according to claim 43, wherein each of the second polarity external electrode terminals located on the pair of opposed longer sides are disposed directly opposite to each other across a width of the capacitor body.

53. The multi-layer capacitor according to claim 43, wherein one of the first polarity external electrode terminals is disposed opposite to one of the second polarity external electrode terminals across a length of the capacitor body.

54. A multi-layer capacitor according to claim 43, wherein the multi-layer capacitor is arranged to define a decoupling capacitor for a multiprocessing unit.

55. A high frequency circuit comprising at least one multi-layer capacitor according to claim 43.

56. The high frequency circuit according to claim 55, wherein the at least one multi-layer capacitor is arranged to define one of a bypass capacitor and a decoupling capacitor.

57. A wiring substrate comprising at least one multi-layer capacitor according to claim 43 mounted thereon.

58. The multi-layer capacitor according to claim 43, wherein a total number of the first and second polarity external electrode terminals located on each of the pair of opposed longer sides is four and a total number of the first and second polarity external electrode terminals located on each of the pair of opposed shorter sides is one.

59. A multi-layer capacitor comprising:
a substantially rectangular capacitor body having four sides including a first pair of opposed longer sides and a second pair of opposed shorter sides, the capacitor body including a plurality of dielectric layers and at least a pair of first and second internal electrodes that oppose each other via one of the dielectric layers to define a capacitor unit, the first internal electrode having first lead-out portions, the second internal electrode having second lead-out portions, the first and second lead-out portions being arranged to interdigitate with each other;
first polarity external electrode terminals being electrically connected to the first lead-out portions, a plurality of the first polarity external electrode terminals being arranged on each of the pair of opposed longer sides and at least one of the first polarity external electrode terminals being arranged on at least one of the pair of opposed shorter sides of the capacitor body; and
second polarity external electrode terminals being electrically connected to the second lead-out portions, a plurality of the second polarity external electrode terminals being arranged on each of the pair of opposed longer sides and at least one of the second polarity external electrode terminals being arranged on at least one of the pair of opposed shorter sides of the capacitor body; wherein
along an entire periphery of the capacitor body each of the first polarity external electrode terminals is located between a pair of the second polarity external electrode terminals and each of the second polarity external electrode terminals is located between a pair of the first polarity external electrode terminals such that an arrangement of polarity around the periphery of the capacitor body alternates between the first polarity and the second polarity;

at least one of the first or second lead-out portions of the first and second internal electrode have a length L and a width W and a ratio L/W is equal to about 3 or less.

60. The multi-layer capacitor according to claim 59, wherein the ratio L/W is equal to about 1.3 or less.

61. The multi-layer capacitor according to claim 59, wherein the ratio L/W is equal to about 0.4 or greater.

62. The multi-layer capacitor according to claim 59, wherein the ratio L/W is equal to or less than about 1.3 and greater than or equal to about 0.4.

63. The multi-layer capacitor according to claim 59, wherein the width W of at least one of the lead electrodes is different from that of the other lead electrodes.

64. The multi-layer capacitor according to claim 59, wherein lead electrodes are provided on each of a first pair of opposed sides of the capacitor body and a lead electrode is provided on each of a second pair of opposed sides of the capacitor body, and the width W of at least one of the lead electrodes provided on a respective one of the second pair of opposed sides of the capacitor body is wider than the lead electrodes disposed on each of the first pair of opposed sides of the capacitor body.

65. The multi-layer capacitor according to claim 59, wherein the lengths L of all of the lead electrodes are substantially equal to each other.

66. The multi-layer capacitor according to claim 59, wherein one of the second polarity external electrode terminals is located on a second of the pair of opposed shorter sides of the capacitor body and the two external electrode terminals which are located closest to the one of the second polarity external electrode terminals are two of the first polarity external electrode terminals located on each of the pair of opposed longer sides of the capacitor body so as to be located on each side of the one of the second polarity external electrode terminals along an outer periphery of the capacitor body.

67. The multi-layer capacitor according to claim 59, wherein each of the first polarity external electrode terminals located on the pair of opposed longer sides are disposed directly opposite to each other across a width of the capacitor body.

68. The multi-layer capacitor according to claim 59, wherein each of the second polarity external electrode terminals located on the pair of opposed longer sides are disposed directly opposite to each other across a width of the capacitor body.

69. The multi-layer capacitor according to claim 59, wherein one of the first polarity external electrode terminals is disposed opposite to one of the second polarity external electrode terminals across a length of the capacitor body.

70. A multi-layer capacitor according to claim 59, wherein the multi-layer capacitor is arranged to define a decoupling capacitor for a multiprocessing unit.

71. A high frequency circuit comprising at least one multi-layer capacitor according to claim 59.

72. The high frequency circuit according to claim 71, wherein the at least one multi-layer capacitor is arranged to define one of a bypass capacitor and a decoupling capacitor.

73. A wiring substrate comprising at least one multi-layer capacitor according to claim 59 mounted thereon.

74. A multi-layer capacitor comprising:

a substantially rectangular capacitor body having four sides including a first pair of opposed longer sides and a second pair of opposed shorter sides, the capacitor body including a plurality of dielectric layers and at least a pair of first and second internal electrodes that oppose each other via one of the dielectric layers to define a capacitor unit, the first internal electrode having first lead-out portions, the second internal electrode having second lead-out portions, the first and second lead-out portions being arranged to interdigitate with each other;

first polarity external electrode terminals being electrically connected to the first lead-out portions, a plurality of the first polarity external electrode terminals being arranged on each of the pair of opposed longer sides and at least one of the first polarity external electrode terminals being arranged on at least one of the pair of opposed shorter sides of the capacitor body; and second polarity external electrode terminals being electrically connected to the second lead-out portions, a plurality of the second polarity external electrode terminals being arranged on each of the pair of opposed longer sides and at least one of the second polarity external electrode terminals being arranged on at least one of the pair of opposed shorter sides of the capacitor body; wherein each of the first polarity external electrode terminals located along a first of the pair of opposed longer sides of the capacitor body is directly opposite to one of the first polarity external electrode terminals located along a second of the pair of opposed longer sides of the capacitor body across a width of the capacitor body and each of the second polarity external electrode terminals located along a first of the pair of opposed longer sides of the capacitor body is directly opposite to one of the second polarity external electrode terminals located along a second of the pair of opposed longer sides of the capacitor body across a width of the capacitor body;

at least one of the first or second lead-out portion of the first and second internal electrode have a length L and a width W and a ratio L/W is equal to about 3 or less.

75. The multi-layer capacitor according to claim 74, wherein the ratio L/W is equal to about 1.3 or less.

76. The multi-layer capacitor according to claim 74, wherein the ratio L/W is equal to about 0.4 or greater.

77. The multi-layer capacitor according to claim 74, wherein the ratio L/W is equal to or less than about 1.3 and greater than or equal to about 0.4.

78. The multi-layer capacitor according to claim 74, wherein the width W of at least one of the lead electrodes is different from that of the other lead electrodes.

79. The multi-layer capacitor according to claim 74, wherein lead electrodes are provided on each of a first pair of opposed sides of the capacitor body and a lead electrode is provided on each of a second pair of opposed sides of the capacitor body, and the width W of at least one of the lead electrodes provided on a respective one of the second pair of opposed sides of the capacitor body is wider than the lead electrodes disposed on each of the first pair of opposed sides of the capacitor body.

80. The multi-layer capacitor according to claim 74, wherein the lengths L of all of the lead electrodes are substantially equal to each other.

81. The multi-layer capacitor according to claim 74, wherein one of the second polarity external electrode terminals is located on a second of the pair of opposed shorter sides of the capacitor body and the two external electrode terminals which are located closest to the one of the second polarity external electrode terminals are two of the first polarity external electrode terminals located on each of the pair of opposed longer sides of the capacitor body so as to be located on each side of the one of the second polarity external electrode terminals along an outer periphery of the capacitor body.

82. The multi-layer capacitor according to claim 74, wherein each of the first polarity external electrode terminals located on the pair of opposed longer sides are disposed directly opposite to each other across a width of the capacitor body.

83. The multi-layer capacitor according to claim 74, wherein each of the second polarity external electrode terminals located on the pair of opposed longer sides are disposed directly opposite to each other across a width of the capacitor body.

84. The multi-layer capacitor according to claim 74, wherein one of the first polarity external electrode terminals is disposed opposite to one of the second polarity external electrode terminals across a length of the capacitor body.

85. A multi-layer capacitor according to claim 74, wherein the multi-layer capacitor is arranged to define a decoupling capacitor for a multiprocessing unit.

86. A high frequency circuit comprising at least one multi-layer capacitor according to claim 74.

87. The high frequency circuit according to claim 86, wherein the at least one multi-layer capacitor is arranged to define one of a bypass capacitor and a decoupling capacitor.

88. A wiring substrate comprising at least one multi-layer capacitor according to claim 74 mounted thereon.

* * * * *